United States Patent [19]
Ogiso et al.

[11] Patent Number: 5,867,074
[45] Date of Patent: *Feb. 2, 1999

[54] SURFACE ACOUSTIC WAVE RESONATOR, SURFACE ACOUSTIC WAVE RESONATOR UNIT, SURFACE MOUNTING TYPE SURFACE ACOUSTIC WAVE RESONATOR UNIT

[75] Inventors: Hiroyuki Ogiso; Shuuichi Iguchi; Fumitaka Kitamura, all of Suwa-shi, Japan

[ * ] Notice: This patent issued on a continued prosecution application filed under 37 CFR 1.53(d), and is subject to the twenty year patent term provisions of 35 U.S.C. 154(a)(2).

[73] Assignee: Seiko Epson Corporation, Tokyo, Japan

[21] Appl. No.: 537,923

[22] PCT Filed: Feb. 28, 1995

[86] PCT No.: PCT/JP95/00311

§ 371 Date: Jan. 18, 1996

§ 102(e) Date: Jan. 18, 1996

[87] PCT Pub. No.: WO95/24075

PCT Pub. Date: Sep. 8, 1995

[30] Foreign Application Priority Data

Mar. 2, 1994 [JP] Japan ................................ 6-032427

[51] Int. Cl.$^6$ ........................................... H03H 9/10
[52] U.S. Cl. .................. 333/193; 333/194; 310/313 A; 310/313 D; 310/348; 310/353
[58] Field of Search .................... 333/193–196; 310/313 R, 313 A, 313 D, 348, 353

[56] References Cited

U.S. PATENT DOCUMENTS 4,580,115  4/1986  Sprengel ................................ 333/193

FOREIGN PATENT DOCUMENTS

| 367181 | 5/1990 | European Pat. Off. ............. 333/193 |
| 56-149812 | 11/1981 | Japan ................................ 333/193 |
| 57-37918 | 3/1982 | Japan ................................ 333/193 |
| 57-52214 | 3/1982 | Japan . |
| 57-170599 | 10/1982 | Japan . |
| 58-40849 | 3/1983 | Japan . |
| 58-133021 | 8/1983 | Japan . |
| 59-1228 | 1/1984 | Japan . |
| 59-36410 | 2/1984 | Japan . |
| 59-54311 | 3/1984 | Japan . |
| 59-61211 | 4/1984 | Japan . |
| 59-152821 | 10/1984 | Japan . |
| 61-99408 | 5/1986 | Japan ................................ 333/193 |
| 61-285815 | 12/1986 | Japan . |
| 62-35704 | 2/1987 | Japan . |
| 62-28095 | 7/1987 | Japan . |
| 63-275215 | 11/1988 | Japan . |
| 1-106513 | 4/1989 | Japan . |

(List continued on next page.)

Primary Examiner—Robert Pascal
Assistant Examiner—Barbara Summons
Attorney, Agent, or Firm—Oliff & Berridge

[57] ABSTRACT

A surface acoustic wave resonator unit using surface acoustic wave, in which a surface acoustic wave resonator formed by disposing an IDT and reflectors on a piezoelectric member thereof is mounted by a cantilever method so that a surface acoustic wave resonator unit exhibiting very stable resonance frequency, a low resonance resistance and a large Q-value is realized. By accommodating the surface acoustic wave resonator in a housing in a vacuum state, the Q-value can be enlarged. By anodic-oxidizing the electrodes forming the IDT, a thick oxide film can be formed, the oxide film enabling the electrodes to be protected from problems, such as short circuit taking due to foreign matters, such as dust, with the characteristics maintained. If the high performance surface acoustic wave resonator unit is molded together with a lead frame by resin, a surface acoustic wave device, that can be mounted on the surface, and that exhibits excellent reliability and high quality, can be provided.

19 Claims, 23 Drawing Sheets

FOREIGN PATENT DOCUMENTS

| | | |
|---|---|---|
| 1-135212 | 5/1989 | Japan . |
| 1-212014 | 8/1989 | Japan . |
| 2-90712 | 3/1990 | Japan .................................. 333/193 |
| 2-256297 | 10/1990 | Japan . |
| 3-11688 | 2/1991 | Japan . |
| 4-3610 | 1/1992 | Japan . |
| 5-28829 | 2/1993 | Japan . |
| 5-121990 | 5/1993 | Japan . |
| 5-136650 | 6/1993 | Japan .................................. 333/193 |
| 06-303077 | 10/1994 | Japan . |

CHANGE IN
RESONANCE RESISTANCE
DUE TO SEALING

SURFACE ACOUSTIC WAVE RESONATOR, SURFACE ACOUSTIC WAVE RESONATOR UNIT, SURFACE MOUNTING TYPE SURFACE ACOUSTIC WAVE RESONATOR UNIT

BACKGROUND OF THE INVENTION

1. Field of the Invention

The present invention relates to a surface acoustic wave resonator unit suitable to form a high-frequency oscillation circuit and an apparatus that exhibit excellent stability.

2. Description of Related Art

A technique for machining small articles, such as integrated circuits, causes fine electrodes to be formed on the surface of a piezoelectric member, thus enabling surface acoustic waves (SAW) to be electrically driven or detected. By using this technique, high frequency waves from about 100 MHz to the GHz level have been stably obtained. A surface acoustic wave device using the surface acoustic waves has been used to form a high-frequency filter (a surface acoustic wave filter) or a surface acoustic wave resonator unit (a SAW resonator unit) for forming an oscillation circuit.

FIG. 27 shows a known surface acoustic wave device. The device 90 has a surface acoustic wave resonator 92 that is, by an adhesive agent 93, secured to a supporting metal portion 91 and sealed in a case 96, by resistance welding or the like, performed in a nitrogen atmosphere. Leads 94 for establishing the electrical connection with the surface acoustic wave resonator 92, penetrate an insulating portion in the metal portion 91, which is a sealing glass 97. The leads 94 are electrically connected to electrodes disposed on the surface acoustic wave device by bonding wires 95.

The known surface acoustic wave device 90 shown in FIG. 28 is a so-called entire-surface adhesive type surface acoustic wave device that has: a base 101 made of ceramic or the like; and a surface acoustic wave resonator 92 attached to the base 101 by an adhesive agent 93. The base 101 has electrodes metallized thereon for establishing the electrical connection with the surface acoustic wave resonator 92 so that the electrodes on the base 101 and the electrodes on the surface acoustic wave resonator 92 are electrically connected to one another by bonding wires 95 similarly to the foregoing structure. Furthermore, a cap 102 is, by an adhesive agent or the like, attached above the base 101 in an atmosphere of nitrogen. The cap 102 is sometimes attached by brazing, welding or the like.

FIG. 29 shows a surface acoustic wave resonator 110 to be accommodated in the foregoing surface acoustic wave device. The surface acoustic wave resonator 110 is formed by using a piezoelectric member 111, such as a quartz crystal member. The piezoelectric member 111 is obtained by cutting a flat piezoelectric substrate to a predetermined size and dimension, the piezoelectric member 111 being usually formed into a rectangular shape as later described by cutting because an area for disposing a reflector can be obtained, a satisfactory mass productivity can be realized, and machining can easily be performed. An interdigital transducer (IDT) 112 is formed in a substantially central portion of either side (the main surface) of the piezoelectric member 111 by using a thin film electrodes made of aluminum material or the like. Furthermore, reflectors 113, each of which is made of a thin film of aluminum material or the like similar to the electrodes, are disposed on the two sides of the IDT 112 in the lengthwise direction of the same, that is, on the two sides of the longer sides of the piezoelectric member 111. Along the lengthwise directional edges of the piezoelectric member 111, connection lands 114 are connected to the IDT 112 for conducting electric power are formed by using the same material as that of the IDT 112. Therefore, the electrical connection can be established by performing wire-bonding to the connection lands 114.

To form a high-frequency-range and stable oscillator by using the surface acoustic wave device, a surface acoustic wave device having a large Q-value (sharpness of resonance) and a low resonance resistance and, therefore capable of resonating a stable resonance frequency, is required. A conventional surface acoustic wave device of the foregoing type comprises a surface acoustic wave resonator brought into close contact with a support substrate by an adhesive agent. Therefore, the difference in the coefficient of thermal expansion between the surface acoustic wave resonator and a portion for supporting the same, contraction of the adhesive agent, deformation of the supporting portion and the like cause the surface acoustic wave resonator to be distorted, as a result of which the resonance frequency to be made instable or the resonance resistance, is increased. Since many of these surface acoustic wave devices have been used as surface acoustic wave filters, considerably large Q-values have not been required. However, a surface acoustic wave resonator that forms an oscillator must be capable of generating resonance frequencies more stably than that required for the filter. Therefore, it is important to use a surface acoustic wave resonator unit having a low resonance resistance and a large Q-value in order to realize a stable oscillator.

In order to obtain a reliable oscillator, the device for forming the same must have excellent reliability. In a surface acoustic wave device, adhesion of foreign matter, such as dust, to the surface, on which the IDT has been formed, causes a problem to arise in that the frequency is changed or stable resonance characteristics cannot be obtained. If the connection between the IDT and the lead becomes defective, stable oscillation characteristics cannot, of course, be obtained, and an increase in the connection resistance occurring due to the defective connection causes the frequency to be changed and the Q-value to be lowered. Accordingly, it is also important to provide a reliable device by eliminating influence of foreign matter and preventing a defective state of connection while preventing influence of distortion on the surface of the surface acoustic wave resonator.

SUMMARY OF THE INVENTION

In the present invention, influence of a supporting member or an adhesive agent on a surface acoustic wave resonator is prevented by supporting only an end of the surface acoustic wave resonator. That is, only either end of a surface acoustic wave resonator in the lengthwise direction of the surface acoustic wave resonator having an interdigital transducer formed in a substantially central portion of the surface thereof, that is cut into a substantially rectangular shape, is connected to the supporting member so that portions, which are affected by the supporting member, are decreased. Furthermore, the surface acoustic wave resonator floats from a housing, such as a case. As a result, the surface acoustic wave resonator is free from external stress and influence, due to distortion, can be eliminated so that a surface acoustic wave resonator unit having a very stable resonance frequency and exhibiting excellent aging characteristics is obtained. That is, mounting of a portion more adjacent to the end than the reflectors (hereinafter called "mounting by a cantilever method") enables influence of distortion upon the surface acoustic wave resonator to be eliminated satisfactorily.

As the structure of the housing for mounting the surface acoustic wave resonator by the cantilever method to form a surface acoustic wave resonator unit, a metal case formed into a cylindrical shape; a round can shape; or a box-like shape and sealed by a supporting member may be employed. The "cylindrical shape" includes a structure having a circular cross sectional shape and that having an oval cross sectional shape. If a cylindrical case is used, the surface acoustic wave resonator is mounted substantially in parallel to a direction in which the case is attached. If a round can or box-like case is used, it is mounted substantially perpendicular to the direction in which the case is attached. The electrical conduction with the surface acoustic wave resonator, thus sealed in the housing, can be maintained by a plurality of leads of the supporting member. The box-like ceramic case may be used to perform sealing. In this case, a deducing pattern may be used to maintain the electrical connection.

The present invention results in a fact to be found that a Q-value of the surface acoustic wave resonator unit, which is a device using surface acoustic wave of a piezoelectric member thereof, is changed due to the atmosphere in the housing. It was found that making of the atmosphere in the housing to be substantially a vacuum will enable a surface acoustic wave resonator unit exhibiting a large Q-value to be obtained.

When the surface acoustic wave resonator is sealed in the housing, inclined mounting such that a central axis of the housing and the surface of a surface acoustic wave resonator intersect enables space in the housing to be used effectively. Thus, problems, such as undesirable contact between the housing and the surface acoustic wave resonator, can be prevented. Therefore, the portion in which the leads are in contact with the surface acoustic wave resonator may be inclined with respect to the central axis of the housing.

To mount the surface acoustic wave resonator by the cantilever method, the piezoelectric member may be supported through a non-conductive adhesive agent. As an alternative to this, the supporting may be performed with conduction established in such a manner that leads are used to establish the connection with connection lands formed on the surface acoustic wave resonator. The foregoing methods may be employed simultaneously or, either of the two methods may be employed as the main method and the other method may be employed as a second method.

When the leads are connected to the connection lands, it is desirable to provide flat connection ends for the leads to maintain an area for conduction or to branch the leading end of the connection end into at least two sections. Since the connection lands usually comprise aluminum based electrodes, connection by means of a usual soldering method cannot easily be established. Since a very thin oxide film is naturally formed on the surface of the electrode, stable electrical conduction cannot easily be maintained using a usual conductive adhesive agent. Therefore, a conductive adhesive agent that contains an oxidation inhibitor mixed thereto is effective when used. To prevent influence of the oxide film on the electrode, it is desirable to form at least one scratch on the connection land after the conductive adhesive agent has been applied or to form a bump on the connection land.

The surface acoustic wave device easily raises a problem due to foreign matter such as dust in the housing. By subjecting at least either of a pair of electrodes forming the interdigital transducer to an anodic oxidation process to form an oxide film having at least a thickness of 280 Å, the foregoing problem can be prevented. If either of the pair of electrodes forming the interdigital transducer is subjected to an anodic oxidation process, the resonance frequency in a wafer state can be measured. Furthermore, a resonance frequency of the surface acoustic wave resonator can be adjusted by the anodic oxidation process.

By integrally molding a surface acoustic wave resonator unit and a lead frame electrically connected to the leads by using resin, a surface mounting type device suitable to be mounted on the surface can be provided. In a case where the housing is made of metal, molding of a lead frame electrically connected to the housing and grounding of the housing enable a surface mounting type surface acoustic wave device capable of withstanding noise to be realized.

DETAILED DESCRIPTION OF THE PREFERRED EMBODIMENTS

Figure 1:
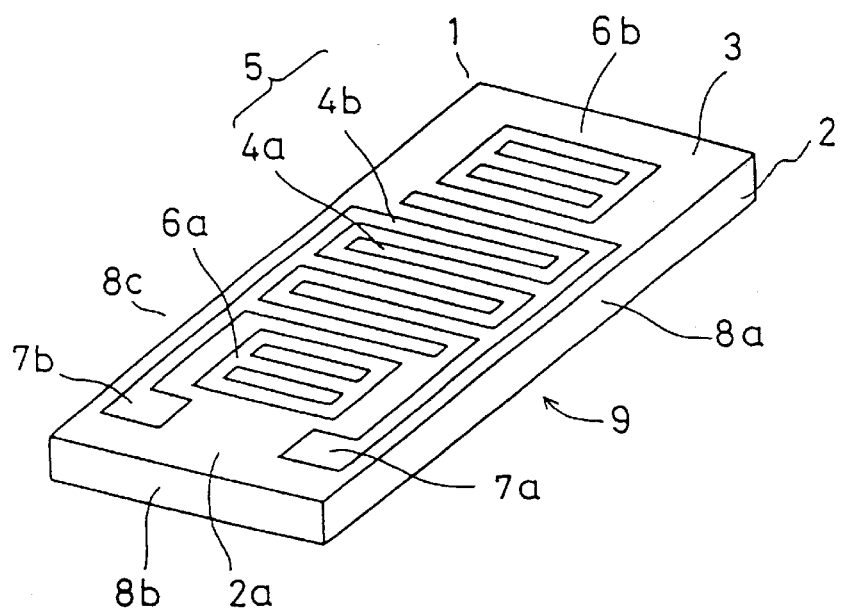
FIG. 1 is a perspective view showing the structure of a surface acoustic wave resonator according to the present invention.

FIG. 1 shows a surface acoustic wave resonator according to the present invention. The surface acoustic wave resonator 1 is formed into a base (a chip) 2 formed by cutting a piezoelectric member made of quartz crystal, lithium tantalate or lithium niobate into a rectangular shape. The piezoelectric chip 2 according to this embodiment is, by cutting, formed into a flat rectangular shape that has, in the central portion of a surface (a main surface) 3 thereof, an IDT 5 consisting of a pair of electrodes 4a and 4b. Furthermore, reflectors 6a and 6b in the form of a lattice are formed on the two sides of the IDT 5 in the lengthwise direction of the same. The pair of electrodes 4a and 4b forming the IDT 5 are allowed to pass through the outside of the reflector 6a, that is, the edge of the chip 2, so as to be introduced into an end 2a of the chip 2 so that connection lands 7a and 7b each having a relatively large area are formed. The electrodes 4, the reflectors 6 and the connection lands 7 are usually made of an electrically conductive material, such as gold, aluminum, or aluminum-copper alloy. In view of manufacturing easiness and cost reduction, aluminum based material has been most widely employed.

Mounting a Surface Acoustic Wave Resonator

Figure 2A:
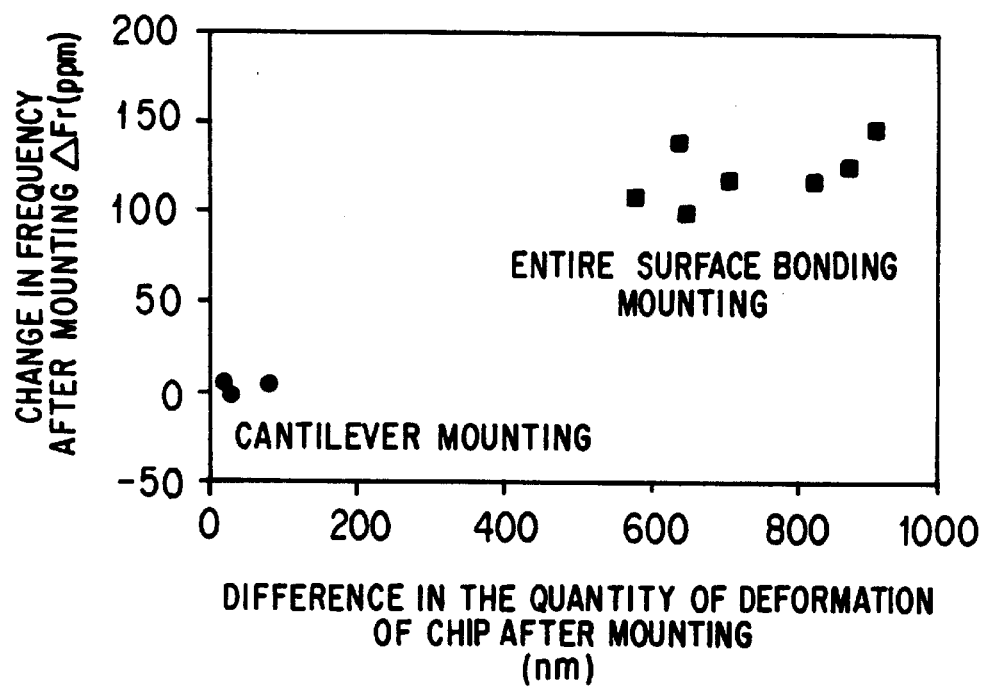
FIGS. 2(a) and 2(b) are graphs showing a comparison of the characteristics of surface acoustic wave resonator units between a case where a cantilever mounting method is employed and a case where an entire-surface bonding mounting method is employed.
Figure 2B:
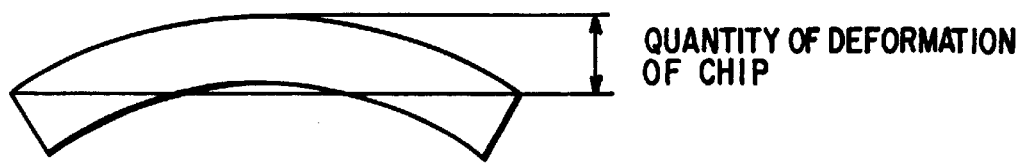
Figure 3A:
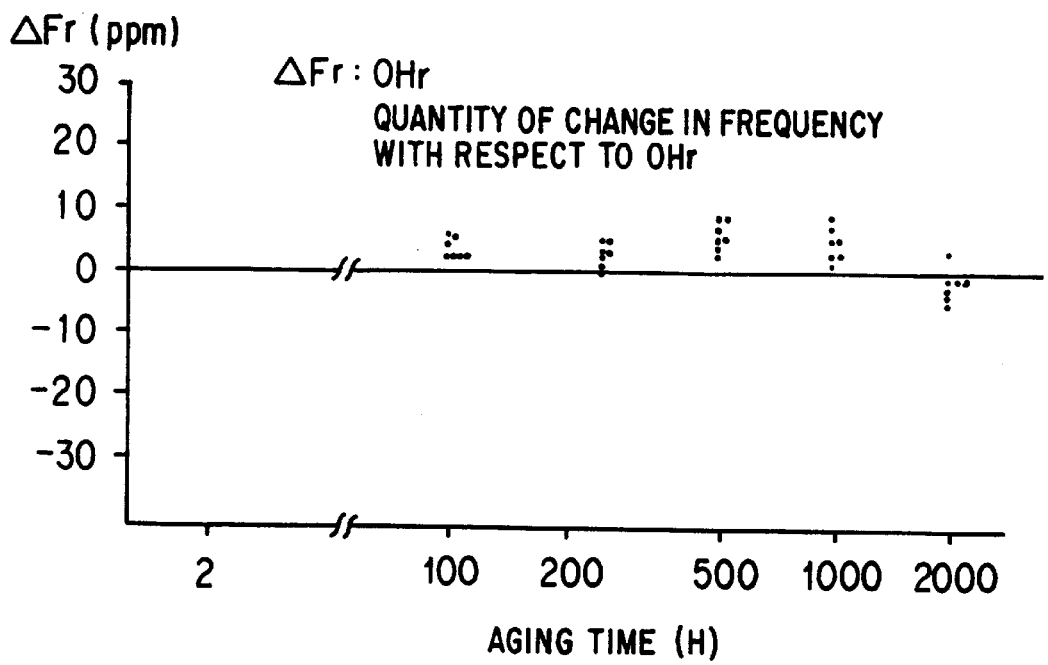
FIGS. 3(a) and 3(b) are graphs showing aging characteristics attained in a case where a cantilever mounting method is employed.
Figure 3B:
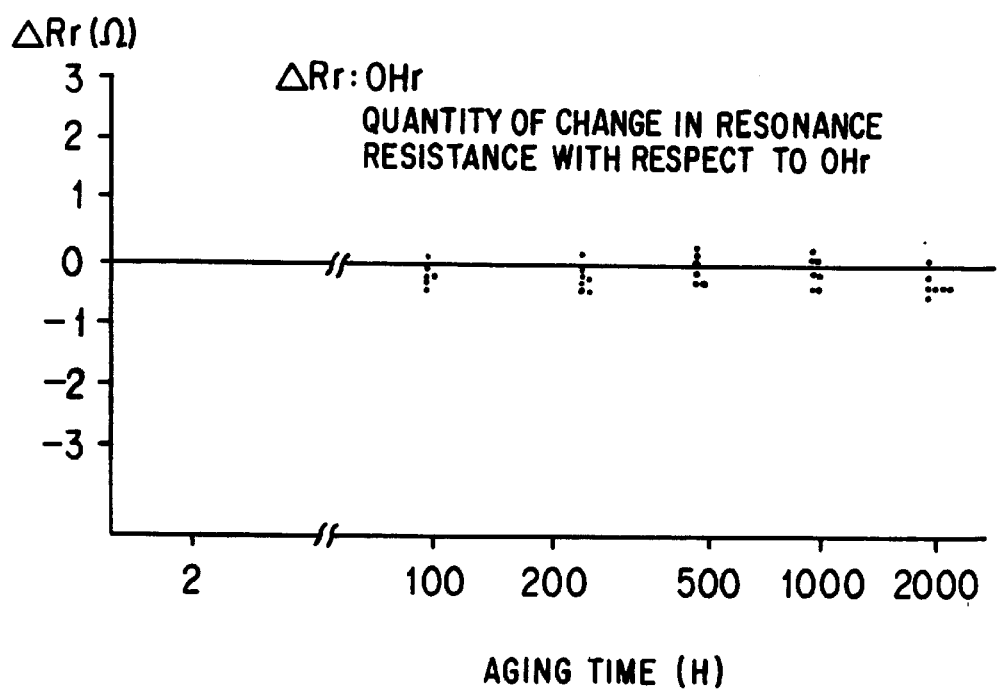
Figure 4A:
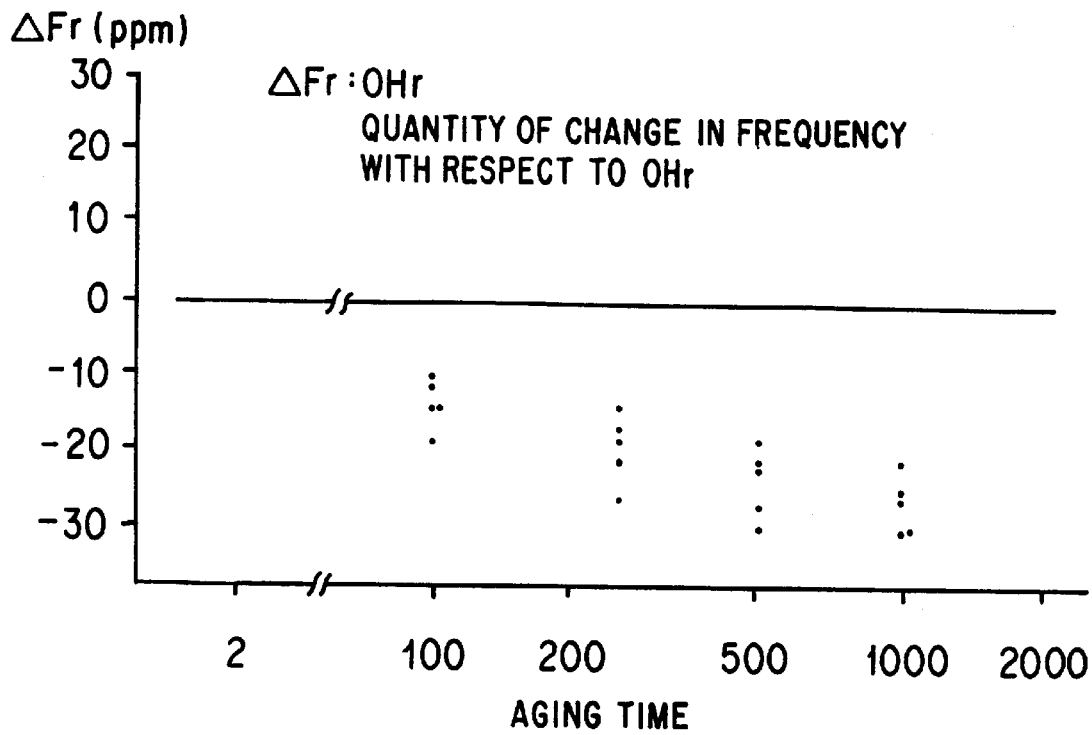
FIGS. 4(a) and 4(b) are graphs showing the aging characteristics attained in a case where the entire-surface bonding mounting method is employed.
Figure 4B:
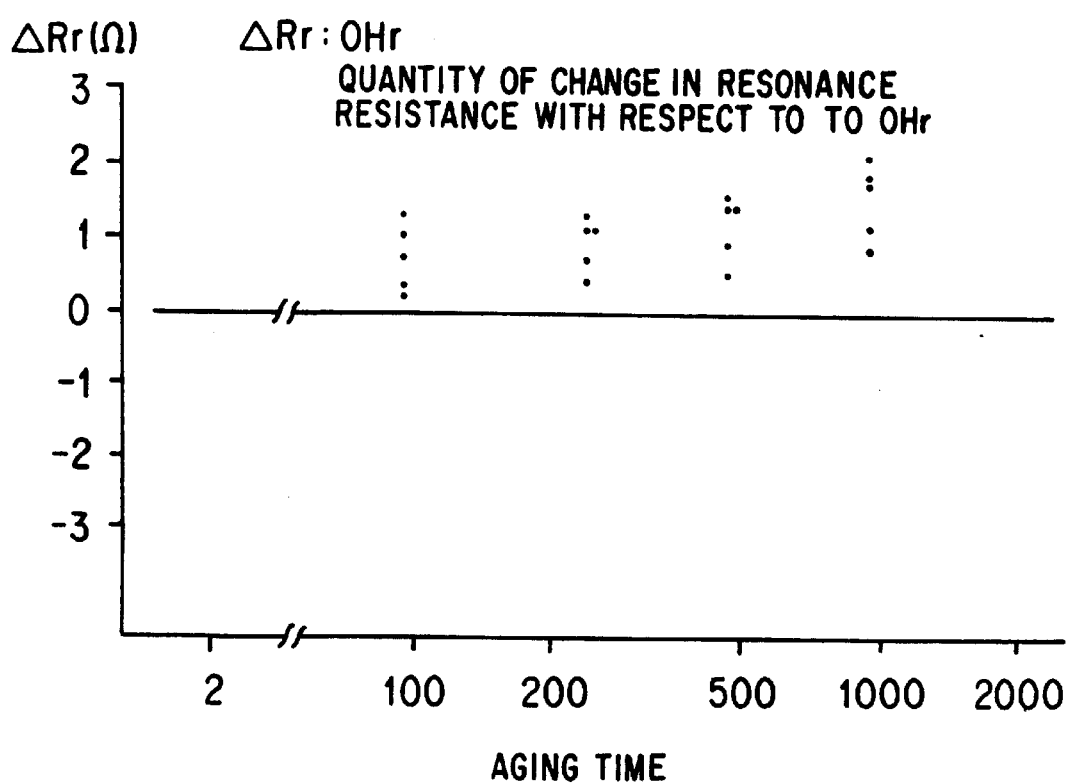

FIG. 2(a) shows change in the resonance frequency (Fr) and the quantity of deformation of the chip 2 attained when the end 2a of the chip 2 of a 145 MHz Rayleigh wave type surface acoustic wave resonator 1 (having a length of 6.5 mm, a width of 1.6 mm and a thickness of 0.4 mm) formed by using ST cut quartz crystal was supported. Furthermore, FIG. 2(b) shows change in the resonance frequency (Fr) and the quantity of deformation of the chip 2 attained when an entire reverse surface 9 opposing the main surface 3 of the chip 2 was supported by using a known adhesive agent. The quantity of deformation of the chip 2 is, as shown in FIG. 2(b), indicated by a maximum quantity of deformation of the main surface 3 in order to reflect distortion and warp of the chip 2.

As can be understood from FIG. 2, in a case where only the end 2a of the chip 2 is supported, that is, in a so-called cantilever mounting method is employed, the frequency is not substantially changed, and also the quantity of deformation of the chip is very small. On the contrary, in the case where the reverse surface 9 of the chip is bonded, that is, in the case of a so-called entire-surface bonding mounting method, the change in the frequency is 100 ppm or larger and also the quantity of deformation of the chip is 500 nm or larger, each of which is excessively large. Since the surface acoustic wave device obtains its resonance frequency from the surface acoustic wave on the main surface, it has been supported by a method such that the reverse surface is strongly connected and influence on the main surface is expected to be eliminated. However, the foregoing has confirmed that the mounting method considerably affects the state of the chip and the resonance frequency. The entire-surface bonding mounting method, which has been expected to be able to stably secure the conventional chip and obtain stable frequency, causes the quantity of the deformation of the chip to be enlarged excessively and the resonance frequency to be changed excessively. On the contrary, where the chip is mounted by the cantilever method the change in the frequency and the quantity of deformation of the chip are reduced considerably. Therefore, to obtain stable and excellent performance, it is preferable that a surface acoustic wave resonator be mounted by the cantilever method.

FIGS. 3(a) and 3(b) and 4(a) and 4(b) show aging characteristics where the foregoing surface acoustic wave resonator is mounted by the cantilever method and where the same is mounted by an entire-surface bonding method. The foregoing figures show results of a measured ΔFr of the resonance frequency and ΔRr of the resonance resistance attained in a state where surface acoustic wave resonators were mounted by the foregoing respective methods, allowed to stand at 85° C. and a predetermined time has passed. The surface acoustic wave resonator mounted by the cantilever method encounters ΔFr of the resonance frequency by about 10 ppm or smaller after 1000 hours have passed. On the other hand, the surface acoustic wave resonator mounted by the entire-surface bonding method has a tendency of resulting in a change of about 30 ppm. Also, results of the measured ΔRr of the resonance resistance gather in the vicinity of about 0 Ω in the case of the cantilever mounting method; on the other hand the entire-surface bonding mounting method results in a tendency of having an increase in the resonance resistance Rr of about 1 Ω to 3 Ω. The foregoing aging tendency is due to hardening of the adhesive agent taking place when the entire-surface bonding mounting process is performed and due to a difference in the coefficients of thermal expansion from the mounted member. The foregoing influences can be eliminated by employing a cantilever mounting method.

The surface acoustic wave resonator mounted by the cantilever method has excellent aging characteristics that are superior to those attainable from conventional entire-surface bonding mounting methods. That is, by mounting a surface acoustic wave resonator by the cantilever method, a resonator having long term stable characteristics can be obtained, and an increase in the resonance resistance Rr can be prevented. Thus, a surface acoustic wave resonator unit having a large Q-value suitable to a stable oscillator can be obtained.

Figure 5:
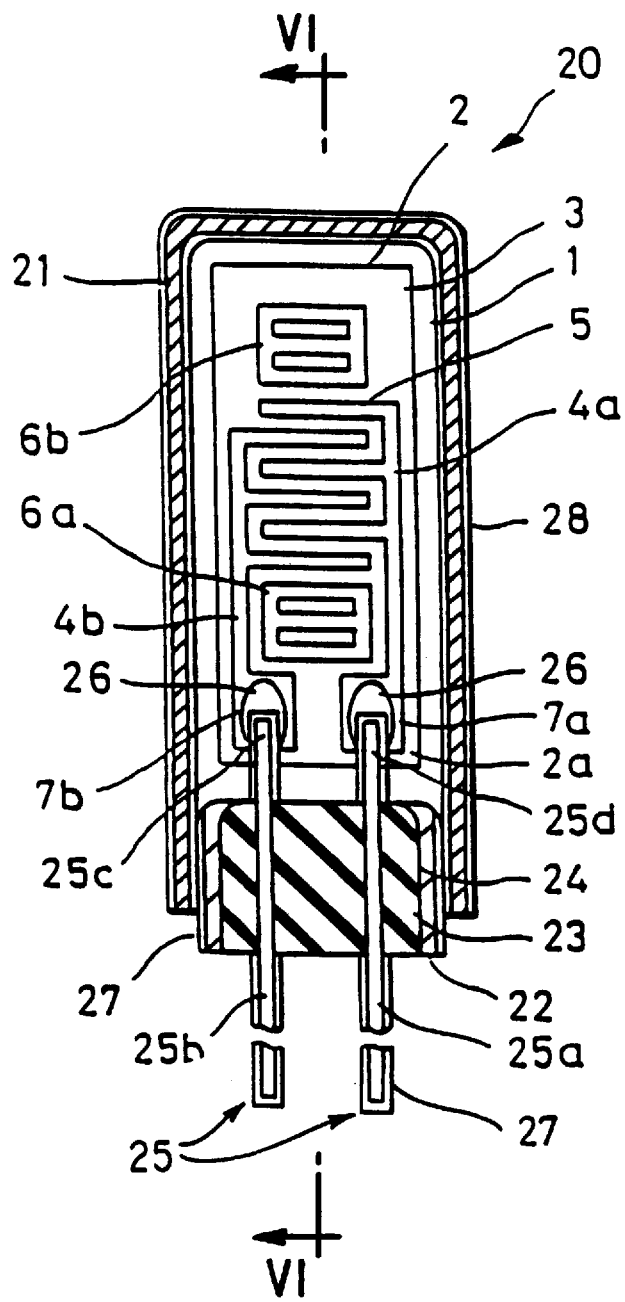
FIG. 5 is a cross sectional view showing a structure of a surface acoustic wave resonator unit having a surface acoustic wave resonator that is mounted in a cylindrical case by a cantilever method.

The surface acoustic wave resonator 1 can be mounted by any of the following cantilever methods. FIG. 5 shows a schematic structure of a surface acoustic wave resonator unit having a surface acoustic wave resonator 1 mounted by the cantilever method by using its leads. The surface acoustic wave resonator unit 20 comprises a metal case 21 formed into a cylinder having an opening at either end thereof and accommodating the surface acoustic wave resonator 1. The opening of the metal case 21 receives a hermetic terminal 22 so that the surface acoustic wave resonator 1 is sealed up in the case 21. The hermetic terminal 22 has a glass portion 23 that is provided with a metal ring 24 disposed on the outer periphery thereof. Two leads 25 penetrate the glass portion 23. Ends 25c and 25d of the leads 25 located in the case 21 are connected to corresponding connection lands 7a and 7b of the surface acoustic wave resonator 1. Thus, the surface acoustic wave resonator 1 is mounted by the cantilever method in the case 21 by the hermetic terminal 22 (hereinafter called a "plug member" including the leads) through the foregoing leads 25.

The leads 25c and 25d are secured to the connection lands 7a and 7b by a coupling agent 26. In order to obtain an electrical conduction, the coupling agent 26 is made of solder or other electrically conductive adhesive agent. It is important to connect the leads 25c and 25d to the connection lands 7a and 7b with a low resistance, as will be described later in detail. The case 21 and the metal ring 24 of the plug member are applied with plug plating 27 and case plating 28 in order to maintain airtightness in the case, the foregoing plating serving as a sealing member, also as will be described later.

Figure 6:
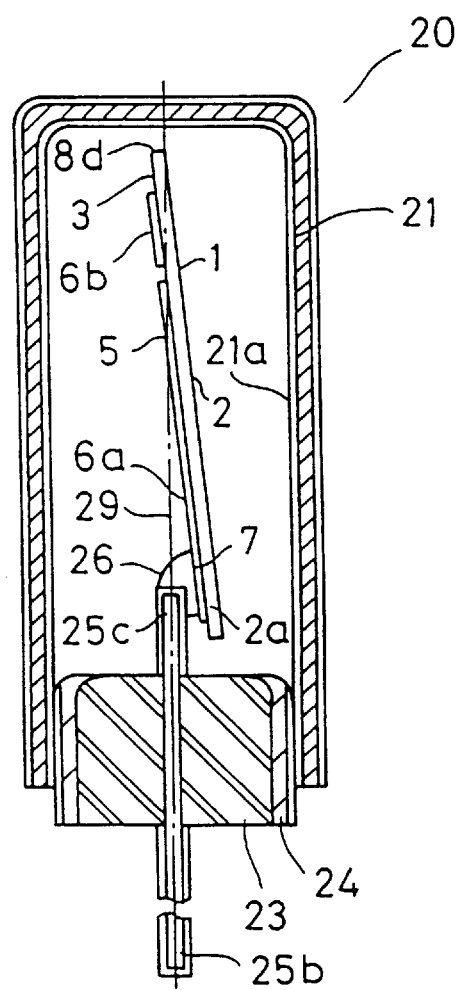
FIG. 6 is a cross sectional view showing the structure of the surface acoustic wave resonator unit when viewed in a perpendicular direction.

FIG. 6 shows the surface acoustic wave resonator unit 20 viewed from a position on the side portion of the surface acoustic wave resonator 1. The surface acoustic wave resonator 1 is connected to the leads 25 in such a manner that its main surface 3 is inclined with respect to a central axis 29 of the case 21 so that the central axis 29 and the surface acoustic wave resonator 1 intersect. By mounting the surface acoustic wave resonator 1 as described above, the surface acoustic wave resonator 1 can be mounted at a substantially central portion of the case 21, even if the leads 25 are disposed at the center of the plug member, whereby a sufficiently large gap can be maintained from the surface acoustic wave resonator 1 and the inner surface 21a of the case 21. By creating this gap as described above, contact between the case 21 and the surface acoustic wave resonator 1 can be prevented when the surface acoustic wave resonator 1 is accommodated in the case 21, whereby a factor that makes oscillation instable can be eliminated. Furthermore, a problem that the resonator comes in contact with the inner surface of the case 21 and thus dust is generated can be prevented.

It is preferable that the angle at which the surface acoustic wave resonator 1 is inclined be determined to be in a range from a position, at which the surface acoustic wave resonator 1 is in parallel to the central axis 29, to a degree at which the other end surface 8d of the chip 2 having no connection land intersects the central axis 29. Since the end 25c of the leads 25 is connected by the adhesive agent 26 and therefore, the necessity of direct contact with the connection lands can be eliminated, the mounting angle can easily be provided. As a matter of course, the end 25c of the leads 25 may be inclined to make a predetermined angle or the end 25c of the leads 25 may be cut or deformed to use the cut surface or the deformed surface to establish the connection with the connection lands 7.

Figure 7:
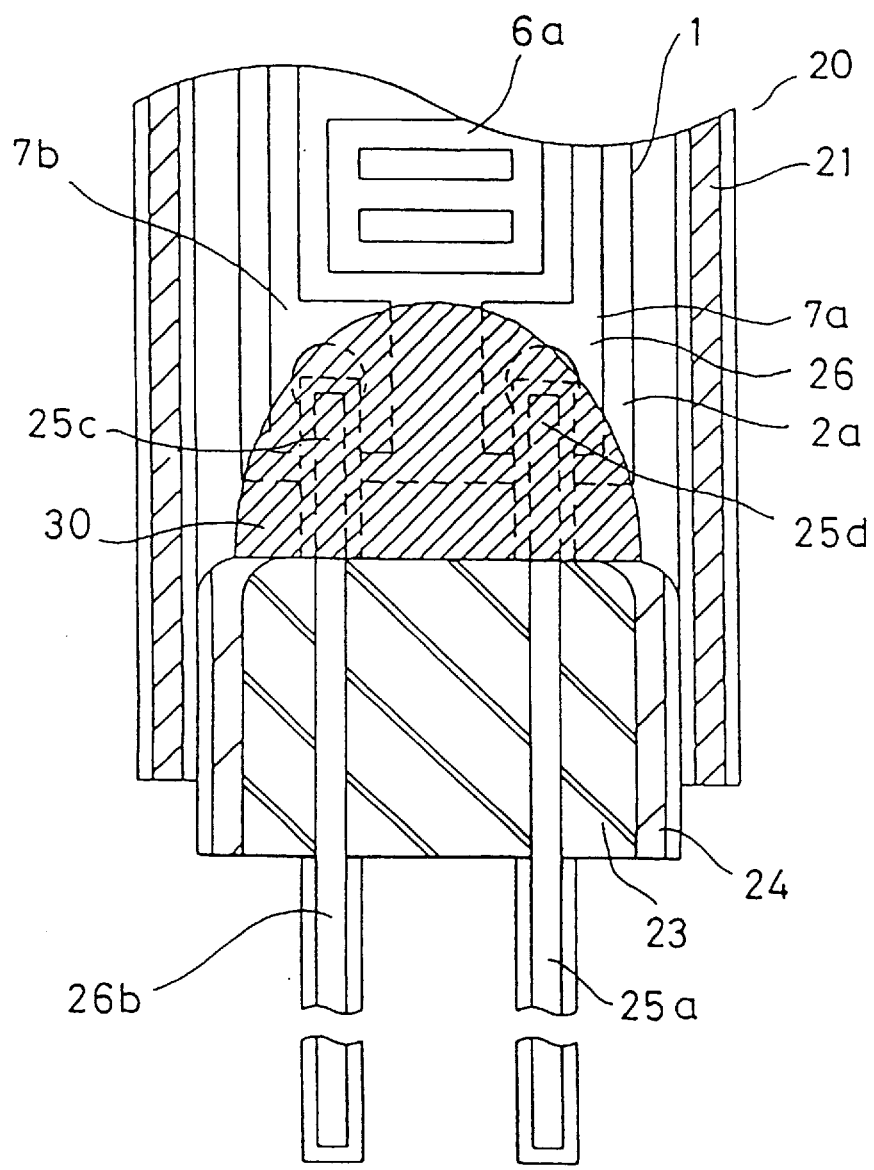
FIG. 7 is a cross sectional view showing a portion of a surface acoustic wave resonator unit is mounted by a further mounting method embodiment.

FIG. 7 shows an example in which a non-conductive adhesive agent 30 is used to mount the surface acoustic wave resonator 1 on the plug member by the cantilever method. Since the leads 25c and 25d are, in the illustrated example, connected to the connection lands 7a and 7b using the conductive adhesive agent 26, the non-conductive adhesive agent 30 is used to reinforce the portion mounted by the cantilever method. The oscillations of the surface acoustic waves are generated on the surface of the chip 2, and the chip must have a thickness that enables the characteristics of the surface acoustic wave resonator 1 to be maintained. The thickness is sufficient to be about 10 times the wavelength of the surface acoustic wave. If the resonance frequency is low, the chip is thickened, and therefore the weight of the surface acoustic wave resonator is enlarged. In the foregoing case, it is preferable that both conductive adhesive agent 26 and the non-conductive adhesive agent 30 be used to mount the surface acoustic wave resonator 1 by the cantilever method with the strength enabling the same to withstand impact and vibrations. It is preferable that the area for the non-conductive adhesive agent 30 to cover the surface acoustic wave resonator 1 be minimized. In consideration of the characteristics of the surface acoustic wave resonator, it is preferable that the area covers the connection lands 7, that is, so the adhesive agent 30 does not reach the reflector 6a adjacent to the end 2a at which the chip is mounted by the cantilever method.

Figure 8:
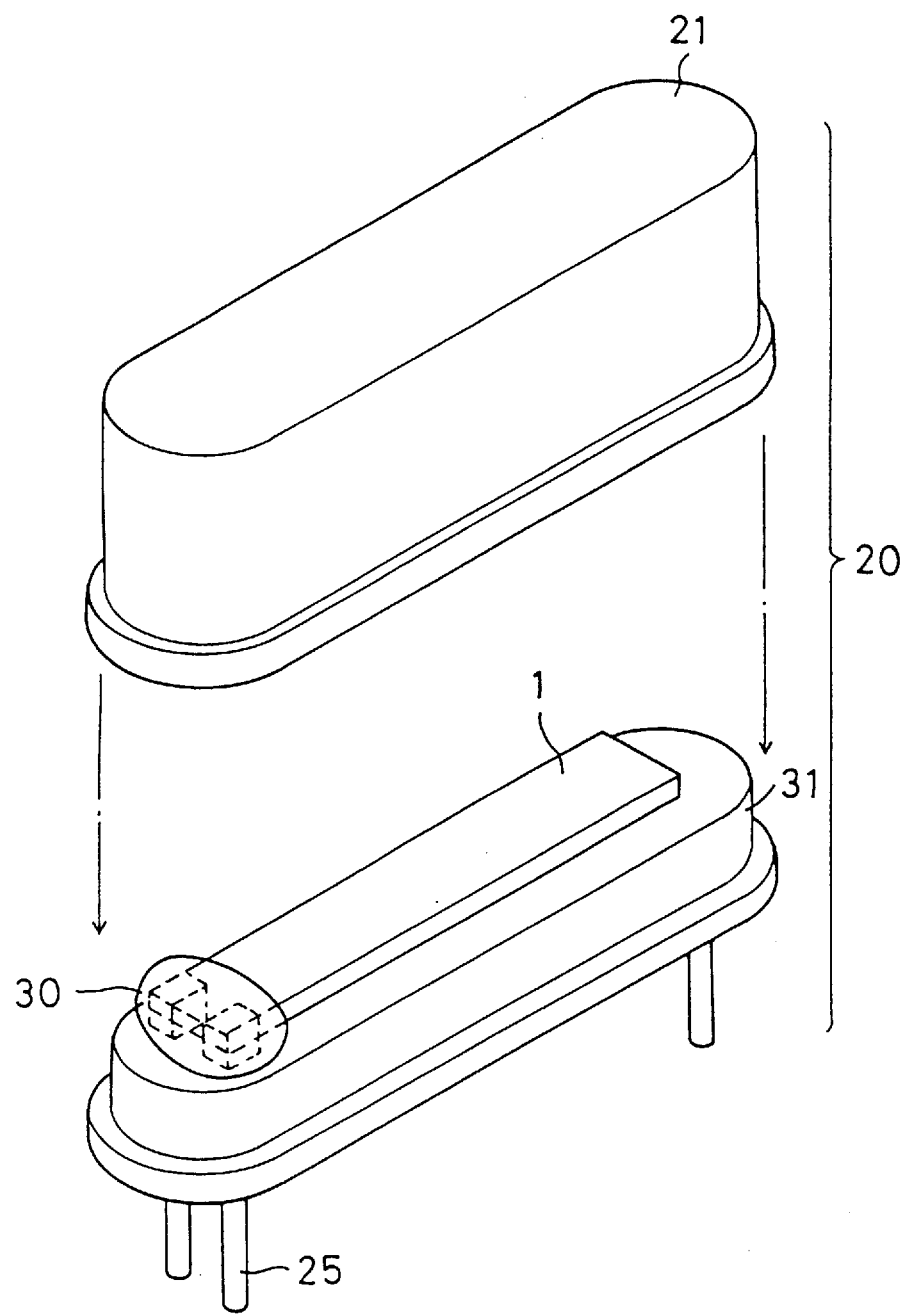
FIG. 8 is a developed perspective view showing a surface acoustic wave resonator unit having a surface acoustic wave resonator mounted in a box-like case by the cantilever method.
Figure 9A:
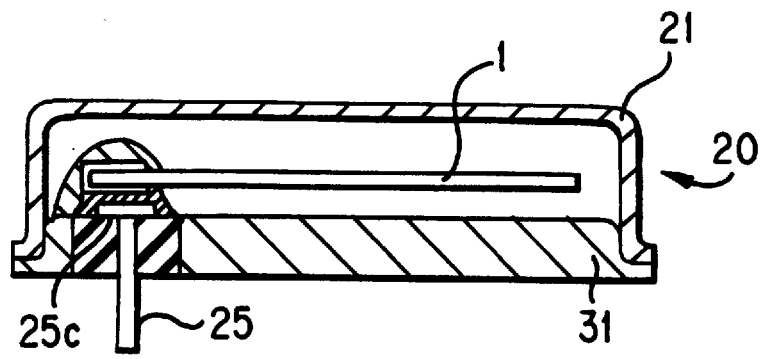
FIG. 9(a) is a cross sectional view of the surface acoustic wave resonator unit shown in FIG. 8.
Figure 9B:
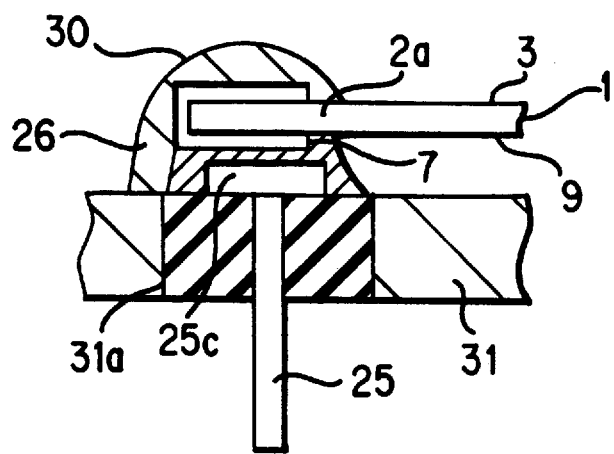
FIG. 9(b) is an enlarged view showing a portion in which the connection with the leads is established.

FIGS. 8 and 9(a) and 9(b) show the surface acoustic wave resonator 1 mounted into a flat-box-like case 21 formed into a substantially oval shape. As shown in FIG. 9, two leads 25 penetrate an insulating member 31a at an end of a flat base 31 having a substantially oval shape. The leads 25 have, at leading ends thereof, flat connection ends 25c extending along the base 31. On the connection ends 25c, the connection lands 7 of the surface acoustic wave resonator 1 are mounted. The leads 25 and the connection lands 7 are secured by the conductive adhesive agent 26. Furthermore, the end 2a of the surface acoustic wave resonator 1 is secured by the non-conductive adhesive agent 30. The above securing method enables the surface acoustic wave resonator 1 to be mounted in a thin case 21 by the cantilever method. The case 21 may, of course, be formed into a round can shape or a square box-like shape.

The surface acoustic wave resonator 1 may be attached in such a manner that its main surface 3, having the IDT formed thereon, faces the base 31 in a manner contrary to FIGS. 9(a) and 9(b). In the foregoing case, the space from the main surface 3 and the base 31 is narrow, whereby foreign matter cannot easily be introduced and satisfactory reliability can be obtained. By employing the cantilever mounting method, the main surface may be caused to face either side. The positions of the connection lands 7 may be suitably positioned, except on the main surface 3 having the IDT formed thereon. They may be formed on the reverse surface 9, the side surfaces 8a and 8c or the side surface 8b shown in FIG. 1. Also where the connection lands 7 are formed on the reverse surface 9 or the side surfaces 8a and 8c, it is preferable that the positions of the connection lands 7 be at the end 2a at which the chip is secured, in order to prevent deterioration in the characteristics of the surface acoustic wave resonator. It is preferable that the connection lands 7 be disposed adjacent to the reflector 6a near the end 2a at which the chip 2 is secured, or disposed at a position more adjacent to the end 2a at which the chip 2 is secured, than the reflector 6a. In particular, it is preferable that the connection lands 7 be formed more adjacent to the securing end 2a than the reflector 6a, similar to the case where they are disposed on the main surface 3. Since a conductive pattern must be formed by using a technique, such as the diagonal evaporation, the connection lands are formed at positions except on the main surface, attention must be paid to prevent defective conduction. To prevent defective conduction, it is important to maintain a sufficiently large area for fixing the conductive pattern. In view of the foregoing, it is preferable that connection lands be formed on the main surface.

Figure 10A:
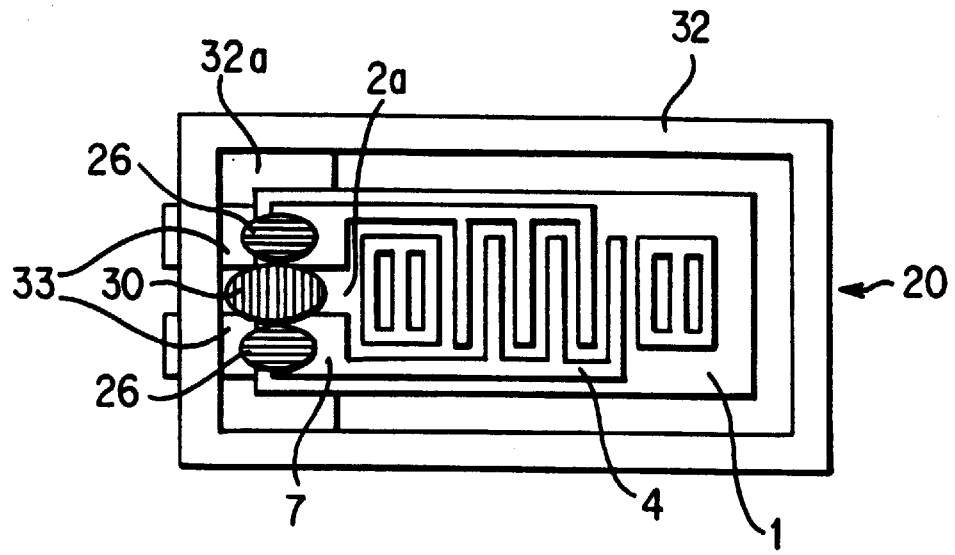
FIG. 10(a) shows a state where the surface acoustic wave resonator is accommodated in a ceramic case by a cantilever method.
Figure 10B:
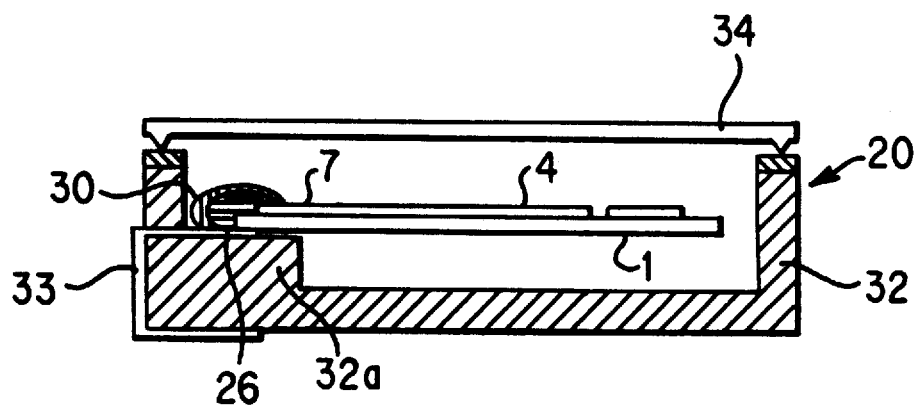
FIG. 10(b) is a cross sectional view showing the structure of a surface acoustic wave resonator unit comprising a ceramic case.

FIG. 10(a) and 10(b) shows an example of the surface acoustic wave resonator unit 20 having the surface acoustic wave resonator 1 mounted by the cantilever method in a ceramic case 32. The ceramic case 32 is formed in a box-like shape having wall surfaces on all sides, at least one of the wall surfaces having a stepped portion 32a. The stepped portion 32a has, on the surface thereof, a pattern 33 extending to the outside of the ceramic case 32. By aligning the position of the conductive pattern 33 and those of the connection lands 7 of the surface acoustic wave resonator 1 to one another, the surface acoustic wave resonator 1 can be mounted by the cantilever method. When the surface acoustic wave resonator 1 is mounted, the connection lands 7 and the conductive pattern 33 are connected to one another by the conductive adhesive agent 26 and the chip securing end 2a is secured to the stepped portion 32a by the non-conductive adhesive agent 30. After the surface acoustic wave resonator 1 has been mounted, a cover 34 is put on the ceramic case 32 and the case is sealed by seam welding.

Figure 11:
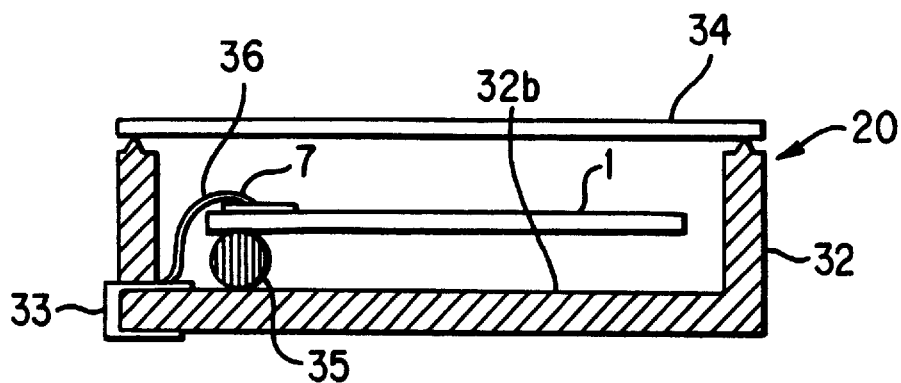
FIG. 11 is a cross sectional view showing the structure of a surface acoustic wave resonator unit employing another embodiment of the cantilever mounting method.

FIG. 11 shows another embodiment in which the surface acoustic wave resonator 1 is mounted into the ceramic case 32 by the cantilever method. In this example, the securing end 2a of the surface acoustic wave resonator 1 floats from a bottom surface 32b of the ceramic case 32 by means of a non-conductive adhesive agent or a spacer 35 made of, for example, ceramic so as to be secured. Furthermore, a bonding wire 36 establishes the electrical connection between the surface acoustic wave resonator 1 and the conductive pattern 33.

For the non-conductive adhesive agent for fixing the surface acoustic wave resonator 1 when the surface acoustic wave resonator 1 is mounted, it is preferable that a thermosetting resin which has a heat resistance capable of sufficiently maintaining the strength thereof in the temperature range so the surface acoustic wave resonator unit can be operated and that does not generate a gas that affects the atmosphere in the case that accommodates the surface acoustic wave, be used. Furthermore, it is preferable that the resin not drop, to prevent spreading to reach the surface acoustic wave resonator and the outer surface of the plug member during hardening. In addition, it is preferable that the resin have a low stress, to prevent accumulation of stress of the surface acoustic wave resonator chip during hardening and the same be hardened at low temperatures. As a non-conductive adhesive agent that satisfies the foregoing conditions, an epoxy adhesive agent can be employed, which can be hardened when it is irradiated with ultraviolet rays or when it is heated.

When the surface acoustic wave resonator is mounted by the cantilever method, its overall body, except the secured end thereof, is caused to float so that dynamical influences, such as pressure and distortion, and thermal influence from the base can be eliminated satisfactorily, as compared with the case where conventional entire-surface bonding mounting method, is employed. Although influences, such as distortion, upon the secured end cannot be prevented, the portions that can be distorted are made to be the outsides of the two reflectors interposing the IDT that entraps the oscillation energy, so that the influence on the oscillation portion can be eliminated. Therefore, the foregoing cantilever mounting method enables a surface acoustic wave resonator unit that is free from machining distortion to be obtained. Thus, a high quality surface acoustic wave device that is not affected by change in the atmosphere can be provided.

Atmosphere In The Housing Accommodating The Resonator

Figure 12:
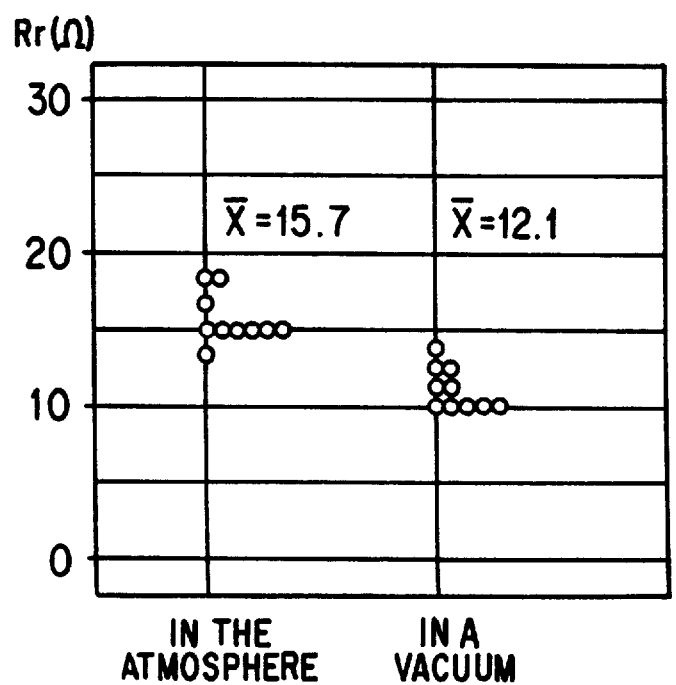
FIG. 12 is a graph showing results of a comparison between the atmosphere in the housing and the values of resonance resistance.
Figure 13:
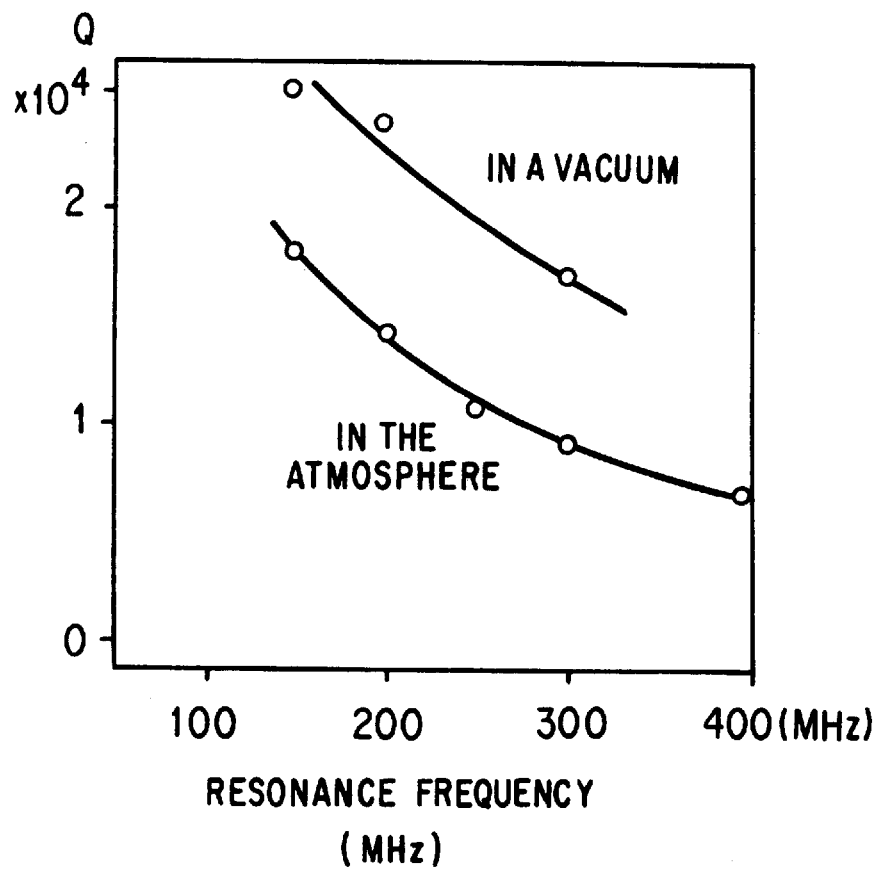
FIG. 13 is a graph showing the relationship between the Q-values and resonance frequencies in a case where the inside portion of the housing is an atmospheric state and in a case subjected to a vacuum state.

To mount a surface acoustic wave device without any influence of the atmosphere, the surface acoustic wave resonator is accommodated in a hollow housing, such as a cylindrical case, a flat case in the form of a box or a ceramic case. FIGS. 12 and 13 represent influences of the atmosphere in the housing upon the resonator unit.

FIG. 12 shows a resonance resistance Rr of surface acoustic wave resonator units shown in FIG. 7, which comprise an ST-cut Rayleigh wave of 145 MHz type surface acoustic wave resonator that is sealed in a vacuum state in a cylindrical metal case having an opening at an end thereof, the pressure in which is $1 \times 10^{-5}$ torr or lower; and a surface acoustic wave resonator unit that is sealed under the atmospheric pressure. As can be understood from FIG. 12, the resonance resistance Rr can be reduced by about $3\Omega$ to $5\Omega$ by sealing the surface acoustic wave resonator unit under vacuum pressure as compared with the surface acoustic wave resonator unit that is sealed under atmospheric pressure. Thus, the surface acoustic wave device, which is a device using the surface acoustic wave of a piezoelectric member, is affected by the atmosphere surrounding the device and that making the atmosphere surrounding the surface acoustic wave resonator to be a vacuum atmosphere will realize a resonator the deterioration of which can be prevented. If the value of the resonance resistance Rr can be reduced, a surface acoustic wave resonator unit having a large Q-value can be provided.

FIG. 13 shows the Q-values of surface acoustic wave resonator units of an ST-cut Rayleigh wave type having a resonance frequency of 100 MHz to 300 MHz that are respectively sealed in the atmosphere and vacuum. The Q-values undesirably decrease in inverse proportion to the frequency. Therefore, it is, as described above, important that a surface acoustic wave resonator unit having a large Q-value in a high frequency range is obtained in order to realize a stable and high-frequency oscillator. As can be understood from the figure above, sealing in a vacuum will provide a resonator having a Q-value at about 200 MHz that is larger by about 60%, as compared with that attained from the case where sealing under the atmosphere pressure is employed.

To seal the inside portion of the housing in a vacuum, a cylindrical case of a type as shown in FIG. 5 can be employed preferably. The shape shown in FIG. 5 is a press-fitting type cylindrical shape for sealing the inside of the housing in an airtight manner. The case 21 is made of a material, such as nickel silver, so that when the plug member is press-fit, a tightening force, generated in the case 21, enables airtightness to be maintained. Between the case 21 and the plug member, there is applied a case plating and plug plating using soft metal having malleability, such as solder or gold, solder being employed in this embodiment, because the cost of which is low and exhibits excellent mass productivity. Therefore, the solder acts as a sealing member so that the gap between the case and the plug member can be plugged. The plating process is usually performed by a plating technique, such as a barrel method or a dipping method. At least an internal surface of the case, with which the plug member is brought into contact, is applied with plating, while the metal ring 24 and the leads of the plug member are applied with plating. Plating exhibiting excellent sealing performance and having malleability may be applied to at least the plug member or case, while other plating processes may be performed by nickel or the like.

If the foregoing press-fitting case is employed, sealing performed in such a manner that the plug member to which the surface acoustic wave resonator is secured is mounted, will make the inside portion of the case to be the same as the atmosphere in which the sealing operation is performed. Therefore, if machining in an atmosphere of a vacuum is employed, the inside portion of the case can be made to be a vacuum. If machining in an atmosphere of nitrogen is performed, the inside portion of the case can be made to be a nitrogen atmosphere. Therefore, a surface acoustic wave resonator unit having a case, the inside of which has been made vacuum and that exhibits a large Q-value, can be manufactured in large quantities and with a low cost by simply aligning the position by using a jig.

By making vacuum the inside of the housing that seals the surface acoustic wave resonator, oxidation of the electrodes can be prevented. Furthermore, a short circuit of the IDT, which is formed in the order of microns, due to dew condensation can be prevented so that the aging prevention is improved. The effects of preventing oxidation of the electrodes and a short circuit due to dew condensation are also obtained from sealing of the inside portion of the housing with an inactive gas, such as nitrogen. By sealing inactive gas in the housing and raising the internal pressure, the generation of harmful gas from the adhesive agent or the like can be prevented.

Conduction Among Connection Lands, Leads and the like

Figure 14:
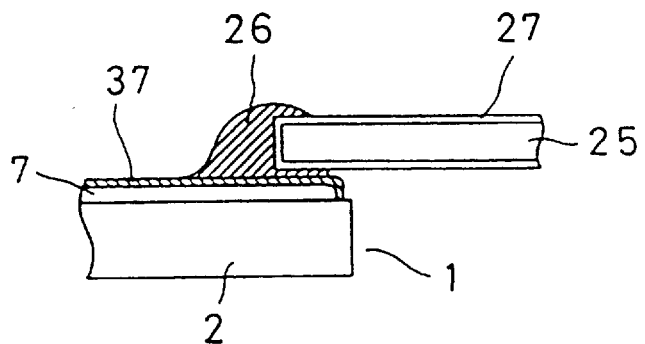
FIG. 14 is an enlarged cross sectional view showing the portion in which the connection land and the lead are connected to each other.

The surface acoustic wave resonator according to this embodiment has electrodes made of aluminum or aluminum based material. Where aluminum electrodes are used, the surface is naturally oxidized to cause an oxide film to be formed, thus resulting in that soldering cannot be performed. Although soldering may be performed by using flux for aluminum, a process, such as washing for maintaining the quality, is required. Thus, mass productivity deteriorates and manufacturing cost is undesirably raised. Accordingly, the connection lands 7 as shown in FIG. 14 are connected to the leads 25 or the deducing pattern by using the conductive adhesive agent 26. It is preferable that the conductive adhesive agent 26 be mixed with an oxidation inhibitor to prevent oxidation of the electrodes. To obtain excellent electrical conduction, it is preferable that silver or copper be employed to make the filler (a material for realizing the conductive characteristic in the conductive adhesive agent).

By using a conductive adhesive agent, a low resistance surface acoustic wave resonator unit can be obtained with a low cost required. Since the non-processed oxide film 37 is left on the surface of the aluminum electrodes, a direct-current conduction cannot be established. Therefore, to reduce the resonance resistance Rr and obtain a surface acoustic wave resonator unit having a larger Q-value, the oxide film 37 must be processed.

Figure 15:
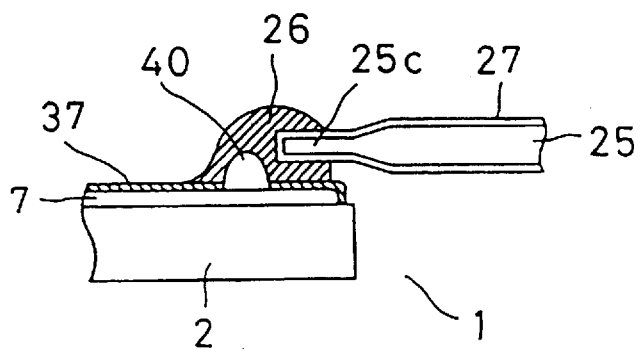
FIG. 15 is a cross sectional view showing the lead is connected by forming a bump on the connection land.

FIG. 15 shows a bump 40 provided at the connection land 7. The connection land 7 made of aluminum or aluminum-copper alloy has the bump 40 formed thereon, which cannot easily be oxidized and exhibits excellent conductivity, for example, gold, silver, solder or the like, by a machining technique, such as sputtering, ion plating or the like. The bump 40 is not affected by the oxide film or the like. Therefore, if the leads 25 or the like including the bump 40, are attached on the connection land 7 by the conductive adhesive agent 26, direct-current conduction can be established and a surface acoustic wave resonator unit having a low resonance resistance Rr and a large Q-value can be obtained. If a soldering plating covering the leads 25 is melted, in place of fixing, using the conductive adhesive agent, the connection with the bump 40 can be established without using flux. In the foregoing case, it is preferable that a non-conductive adhesive agent be used for a reinforcement to obtain the strength required to mount the surface acoustic wave resonator 1 by the cantilever method.

Figure 16:
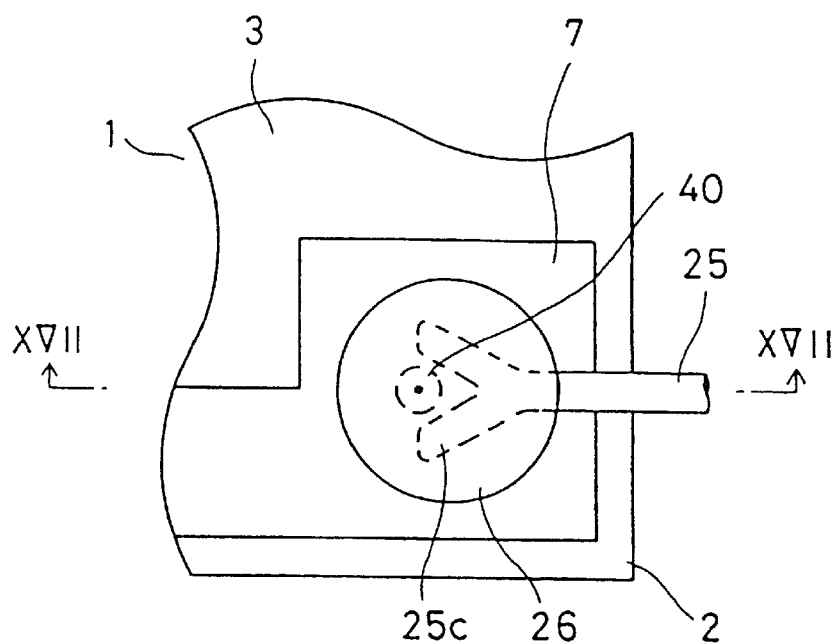
FIG. 16 is a plan view showing a state where a lead, the leading end of which is branched into two sections, is connected to a connection land.

FIG. 16 shows the leads 25 connected to the connection lands 7 viewed from a position above the main surface 3. The connection end 25c of the leads 25 according to this embodiment is deformed into a flat shape and branches into two sections. The two branched sections are attached by the conductive adhesive agent 26 so they extend on the two sides of the bump 40. By deforming the connection end 25c of the lead, its area that is in contact with the conductive adhesive agent 26 can be enlarged, whereby the contact resistance can be reduced. Simultaneously, a large adhesive force can be obtained. By branching the connection end 25c into two or more sections, disposition while being combined with the bump 40 formed on the connection lands 7 can easily be performed. Therefore, areas of the connection lands 7 can effectively be used and an excellent conduction with the bump 40 can be established. By providing the foregoing branch, the leads 25 can be strongly secured by the adhesive agent 26 so the surface acoustic wave resonator 1 is mounted by the cantilever method using the leads 25.

Figure 17:
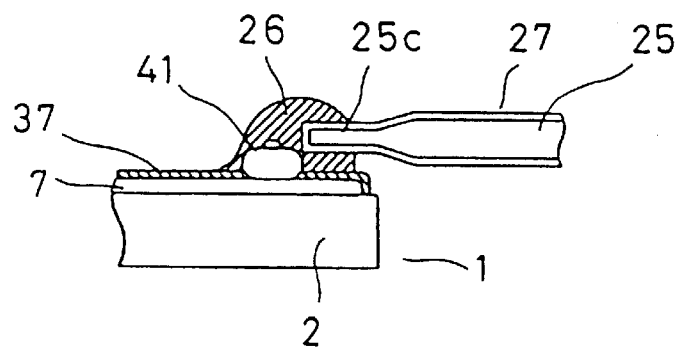
FIG. 17 is a cross sectional view showing the lead is connected by forming a stud bump on the connection land.

FIG. 17 shows a stud bump 41 provided for the connection land 7 by the wire bonding method. The stud bump 41 can be formed by removing the oxide film 37 by ultrasonic vibration and by wire-bonding metal, such as gold or copper. Even if the oxide film 37 is relatively thick, the stud bump 41 can be provided at a low cost and with simple work. In a case where the bump is formed by evaporation or the like, large energy is required if the oxide film is thick, and thus a large cost is required. Therefore, the stud bump 41 according to this embodiment exhibits excellent mass productivity and enables the cost required for manufacturing to be reduced. As a matter of course, a similar effect can be obtained from the stud bump 41 even where a wire is arranged on the connection land 7. By providing the bump for the connection land 7 as described above, the contact resistance with the leads can considerably be reduced. As a result, the resonance resistances Rr of a surface acoustic wave resonator unit (a cylindrical surface acoustic wave resonator unit oscillating a resonance frequency of 145 MHz) having no bump at the connection land distribute widely to about 20$\Omega$ to 40$\Omega$, whereas provision of the bump is able to reduce the resonance resistance to about 10$\Omega$ to 20$\Omega$. By providing a bump, variation of the resonance resistance Rr can be within a narrow range, whereby a surface acoustic wave resonator unit exhibiting stable performance can be obtained.

Figure 18:
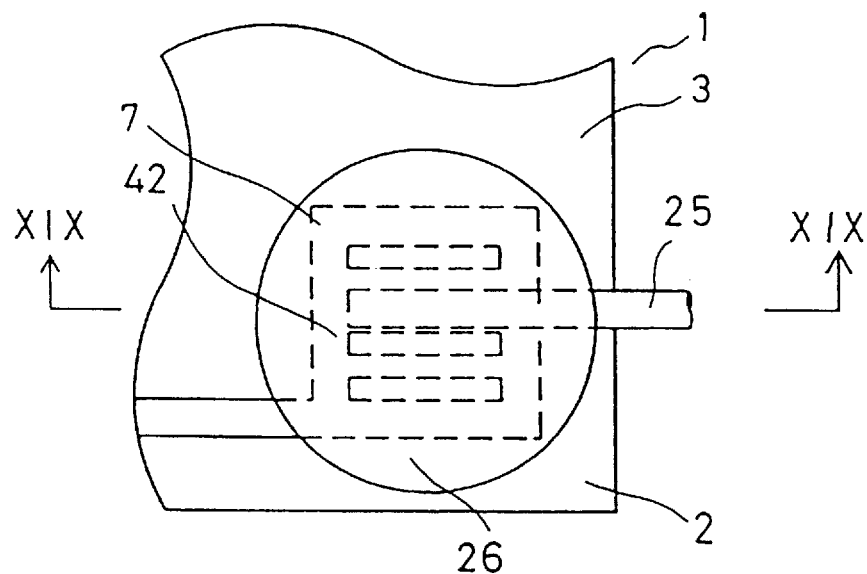
FIG. 18 is a plane view showing the lead is connected by providing a scratch on a connection land.
Figure 19:
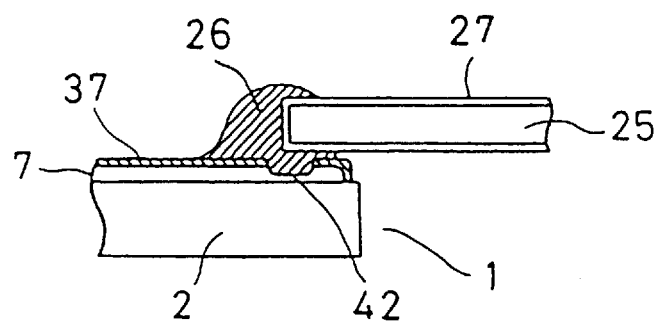
FIG. 19 is a cross sectional view showing the lead is connected to the connection land shown in FIG. 18.

FIGS. 18 and 19 show another embodiment for establishing a conduction with the connection land 7. In this embodiment, the lead 25 is mounted on the connection land 7, followed by an application of the conductive adhesive agent 26. The surface of the connection land 7, covered with the adhesive agent 26, is scratched by a jig having a sharp leading end before the adhesive agent 26 is hardened. The scratch 42 may consist of one or more lines to run parallel to the leads 25 or perpendicular to the same. By forming the scratch 42, a portion from which the oxide film 37 has been removed can be formed to cause the aluminum portion of the connection land 7 to be exposed. Therefore, direct-current conduction can be established between the connection land 7 and the leads 25 through the conductive adhesive agent 26. If a scratch is formed on the outside of the range for the adhesive agent 26, the exposed portion is initially oxidized and an oxide film is again synthesized, thus requiring attention to be directed there. If the connection land is separated by the scratch 42, the conduction of the electrodes cannot easily be established and the scratch out of the adhesive agent causes the oxide film to be formed, thus requiring attention to be directed there.

The scratch 42 can be formed by pressing the leads 25 against the connection lands 7, by mechanically vibrating the same with ultrasonic vibrations or the like. If the adhesive agent 26 is applied by a dispenser or the like, the scratch may be formed by the leading end of a nozzle of the dispenser, when the agent 26 is applied. As an alternative metal, except the lead, may be vibrated or rubbed to form the scratch. The thus-formed scratch is able to reduce conduction loss of the connection land due to contamination or the like. Note that the process must be performed before the adhesive agent 26 is hardened. The scratch is able to improve the value of the resonance resistance Rr, similarly to the case where the bump is formed. In particular, it is preferable that the scratch be formed in a line rather than formed as a dot. Furthermore, random formation of three or more lines of scratches will attain an effect similar or superior to that obtainable from the formed bump. In addition to the resonance resistance Rr, the inventor has measured change in the direct-current resistance value. In accordance with the results of the measurement, no process of the oxide film results in a wide range of the direct-current resistance from 5$\Omega$ to infinite, whereas the scratch or the bump results in accurate convergence to values about 1$\Omega$ to 2$\Omega$. Thus, the formed scratch or bump enables the influence of the oxide film to be eliminated, so that a surface acoustic wave resonator unit having a low connection resistance (direct-current resistance) and exhibiting a large Q-value is realized.

To obtain the foregoing effects, a scratch where the oxide film has been removed is required for the connection land. Therefore, the scratch is provided for the connection land after the conductive adhesive agent has been applied. In a contrary case where the scratched connection lands and the leads are connected to one other in a state of a low connection resistance, the foregoing scratches are formed after an adhesive agent has been applied. If the scratches are formed and the internal surface of the scratch is again oxidized, a satisfactory conductive state cannot be obtained. Accordingly, it is preferable that a conductive adhesive agent of a type containing an oxidation inhibitor mixed thereto be employed. As the oxidation inhibitor, a reducing type inhibitor, such as hydroquinone, catechol, or phenol, is employed. Furthermore, mixing of different type metals, such as nickel, may be mixed, in addition to silver particles, to stabilize the contact resistance and to attain an effect of preventing oxide film being formed.

Also, the effect of the oxidation inhibitor has been confirmed due to experiments performed by the inventor. A surface acoustic wave resonator unit, in which an adhesive agent having no oxidation inhibitor was used encountered change in the resonance frequency by 100 ppm or more due to annealing at 230° C. for 10 hours after the adhesive agent had been hardened. Also the value of the resonance resistance Rr was resulted in rise to 30$\Omega$ to 40$\Omega$ as compared with a value of 20$\Omega$ or less before annealing was performed. If an adhesive agent containing an oxidation inhibitor is used, the change in resonance frequency can be converged within about 20 ppm, and a satisfactory value of the resonance resistance Rr of 20$\Omega$ or less can be maintained.

Protection of Electrodes

In the present invention, the surface acoustic wave resonator is mounted by the cantilever method in such a manner that it is supported while being caused to float from the housing, such as a cylindrical or ceramic case. Furthermore, a space is provided around the surface acoustic wave resonator to protect the surface acoustic wave resonator from being affected from the surrounding atmosphere. In the foregoing surface acoustic wave resonator unit, the space formed around the surface acoustic wave resonator serves as a space in which foreign matter, such as dust of SUS or solder dust, that can be mixed when the surface acoustic wave resonator is sealed, can move. The foregoing foreign matter is able to move between the electrodes of the surface acoustic wave resonator, for example, the electrodes of the IDT or the electrodes that establish the connection between the IDT and the connection land. Since the IDT is in the order of microns, existence of the conductive foreign matter between the electrodes causes a short circuit to take place. Thus, the stable operation of the surface acoustic wave resonator unit is inhibited. Furthermore, it is difficult to completely prevent the mixture of foreign matter. Since the surface acoustic wave resonator unit is used in a variety of purposes, the foreign matters can move due to impact during mounting or transporting or due to the angle of mounting. Therefore, it is difficult to completely prevent the foregoing problem at the time of assembling the surface acoustic wave resonator unit or mounting the same.

To prevent the problem raised due to foreign matter, the IDT or the like may be applied with a coating, such as silicon oxide. However, the layer of different material formed on the chip causes the resonance frequency to be changed and the Q-value to be lowered. Thus, the effect of the cantilever mounting method is minimized. Accordingly, the inventor paid attention on the effect of the oxide film formed on the surfaces of the aluminum electrodes. As described above, oxide films are naturally formed on the surfaces of the aluminum electrodes these formed oxide films are able to prevent short circuit. However, since the oxide film that is naturally formed is very thin having a thickness of 10 Å to 30 Å, it cannot completely protect the electrodes from foreign matter that moves due to impact, such as falling.

Accordingly, in the present invention, the aluminum electrodes of the surface acoustic wave resonator are anodic-oxidized, so that a thick oxide film having a thickness about 280 Å or thicker is formed on the surfaces of the electrodes, in order to prevent problems taking place due to foreign matter.

Figure 20:
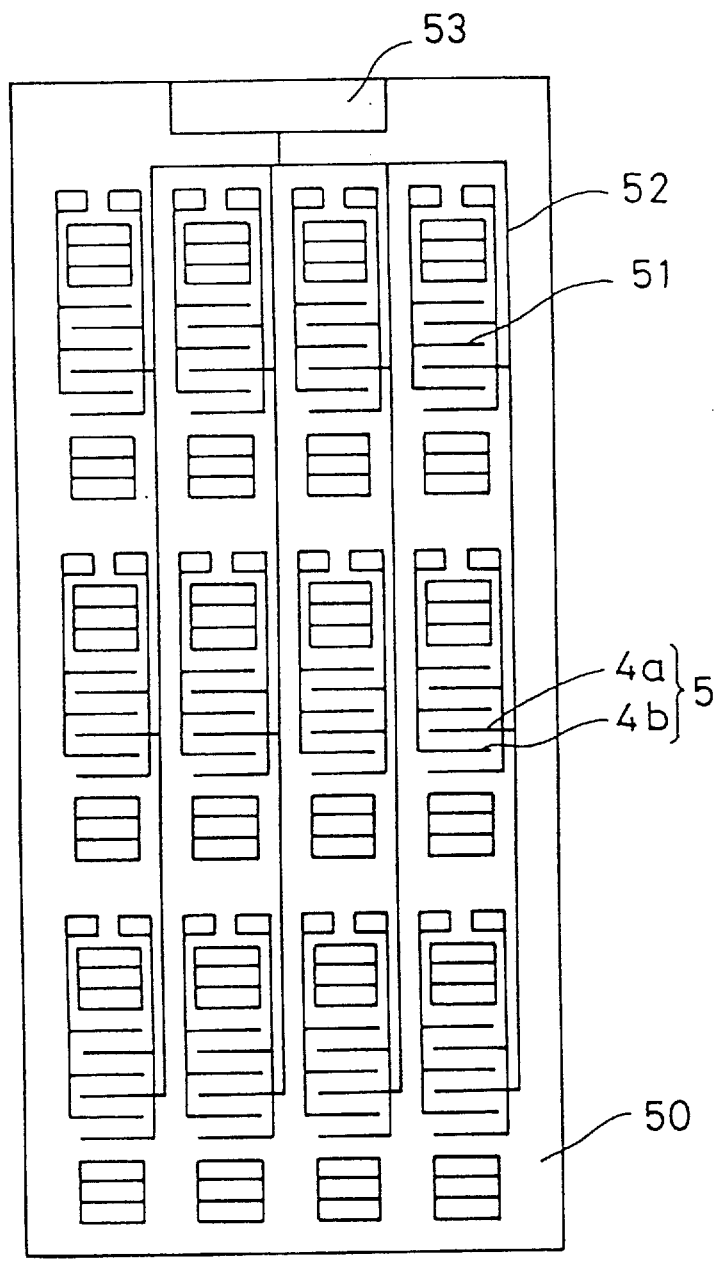
FIG. 20 is a diagram showing a pattern for oxidizing only either side electrode formed on a wafer for performing anodic oxidation.

The anodic oxidation is performed by using a structure in which a plurality of surface acoustic wave patterns 51 are formed on a wafer 50 of a piezoelectric member, as shown in FIG. 20. In this embodiment, either of the electrodes 4a and 4b, that form the IDT 5, is subjected to the anodic oxidation. Therefore, the wafer 50 is provided with, in addition to a surface acoustic wave pattern, a connection line 52 that establishes the connection with the electrode 4a of the surface acoustic wave pattern 51 and a terminal 53 that establishes a connection with a power source for anodic oxidation.

Figure 21:
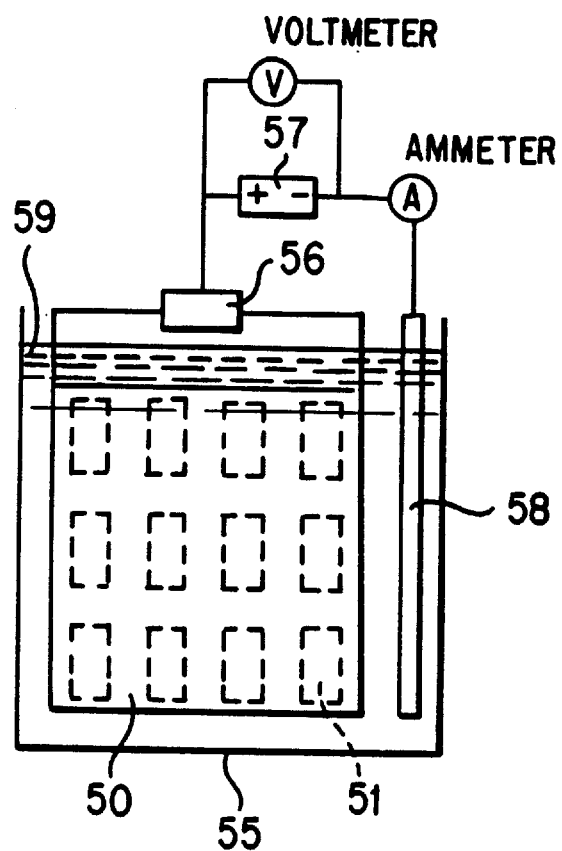
FIG. 21 is a diagram showing a tool for performing the anodic oxidation.

FIG. 21 shows an outline of an apparatus for performing the anodic oxidation. A tank 55 includes anodic oxidation liquid 59 and a clip 56 that holds the terminal 53 of the wafer 50 so the wafer 50 is immersed in the oxidizing liquid 59. A power source 57 is used to supply electric current so that the portion including the wafer 50, is made to be an anode. Also, a cathode 58 immersed in the oxidizing liquid 59, is connected to the power source 57. In this embodiment, anodic oxidation enables a non-porous oxide film to be formed. Therefore, the oxidizing liquid 59 is water solution of phosphate or liquid mixture of a water solution of borate. As an alternative, a water solution of a salt near neutral, such as citric acid or adipic acid, may be used. It is preferable that the temperature of the liquid be near room temperature in order to prevent porous film being formed. For example, in a case where water solution of borate is used, it is preferable that the temperature be about 20° C. to about 30° C.

If anodic oxidation is performed under the foregoing conditions, oxide films each having a thickness that is substantially in proportion to the applied voltage can be formed on the surfaces of the electrodes. To control the thickness of the oxide film and to control the electric current flowing when the electric current is supplied to be a level lower than a predetermined level, it is preferable that a constant-voltage and constant electric current power source be employed as the processing power source. Since it is preferable that portions of the electrodes corresponding to the connection lands be subjected to a process for removing the oxide film as described above, it is preferable that the portions corresponding to the connection lands be applied with a resist or the like, to prevent an increase in the thickness of the oxide film.

Figure 22:
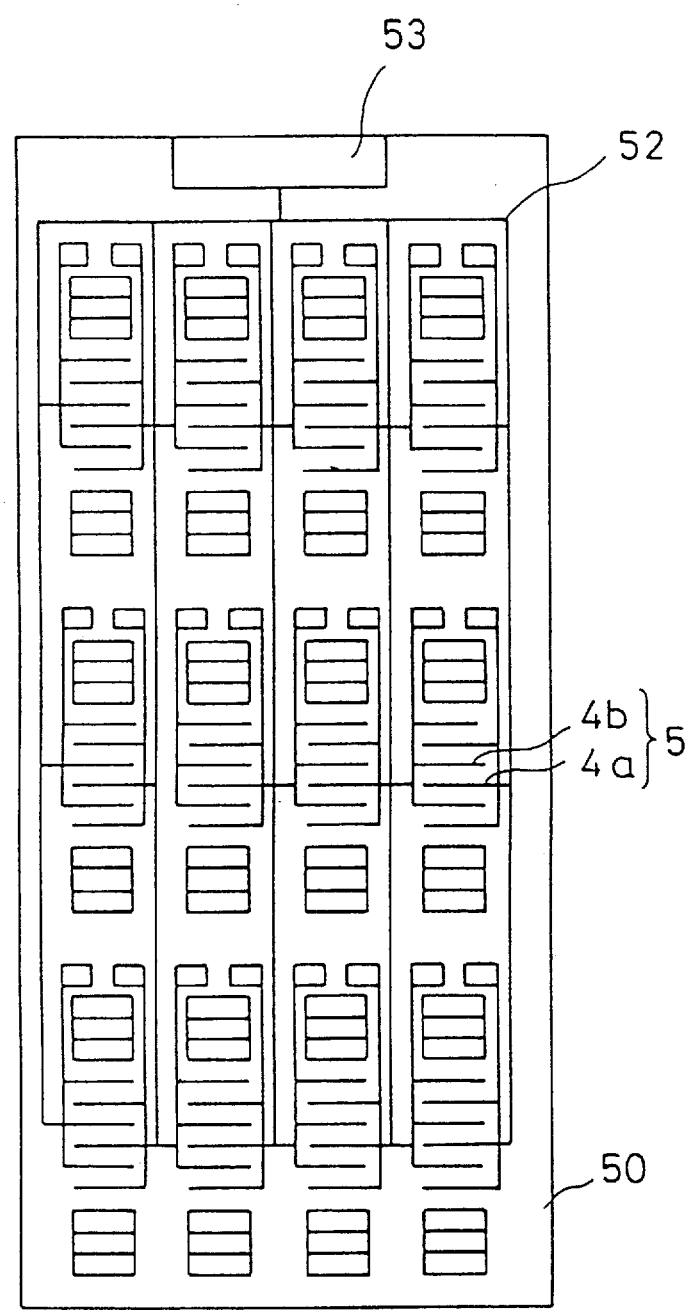
FIG. 22 is a diagram showing a pattern for oxidizing electrodes on two sides.
Figure 23:
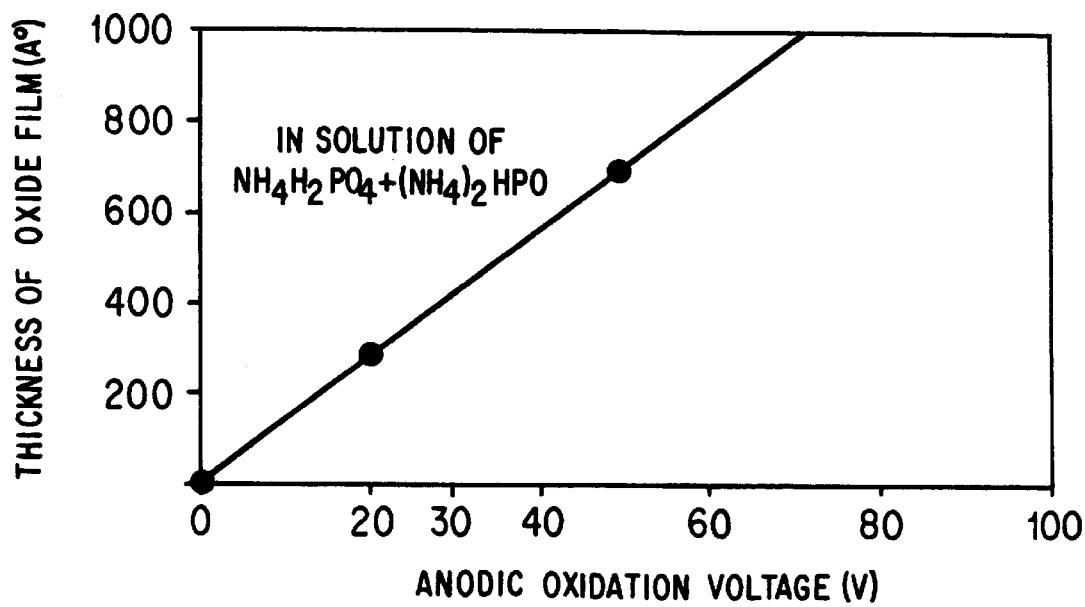
FIG. 23 is a graph showing change in the thickness of the oxide film with respect to anodic oxidizing voltage.

The inventor has measured frequency of generation of problems in a case where foreign matter (SUS dust having diameters from 5 μm to 10 μm) of SUS was forcibly mixed into a cylindrical case. As a result, about 100% of resonators that were not subjected to anodic oxidation encountered a short circuit after a repeated falling test (results of the falling tests repeated five times from height of 75 cm to 150 cm). On the other hand, surface acoustic wave resonator units having the electrodes on either side of the IDT being subjected to the anodic oxidation resulted in the frequency in the generation of short circuits being decreased. Where the anodic oxidation voltage was made to be about 30 V, the frequency in the generation of short circuits can be substantially halved. If the anodic oxidation voltage was raised to a level higher than 50 V, the frequency in the generation of short circuits can be substantially eliminated. Electrodes on the two sides of the IDT can be anodic-oxidized by using a pattern shown in FIG. 22 or by a similar method. Resonators of this type resulted in the frequency in the generation of short circuits being substantially eliminated when the anodic oxidation voltage was made to be 20 V or higher. As shown in FIG. 23, when the anodic oxidation voltage was 20 V, the thickness of the oxide film was about 280 Å, whereas it was about 700 Å when the anodic oxidation voltage was 50 V.

Where an oxide film is forcibly formed on the electrodes on either side of the IDT, the film must have a thickness thicker than the oxide films formed on the electrodes on the two sides, the required thickness being about two times as a result of conducted experiments. However, since the electrodes on either side of the IDT can be individually formed for each pattern, the resonance frequency for each pattern can be previously measured in a wafer state, before chips are formed by cutting. In accordance with the measured resonance frequency, the process for forming the oxide film is repeated to enable the operations for adjusting the resonance frequency during the manufacturing process, such as the major adjustment in the wafer state and the minor adjustment for each surface acoustic wave resonator to be performed.

Figure 24:
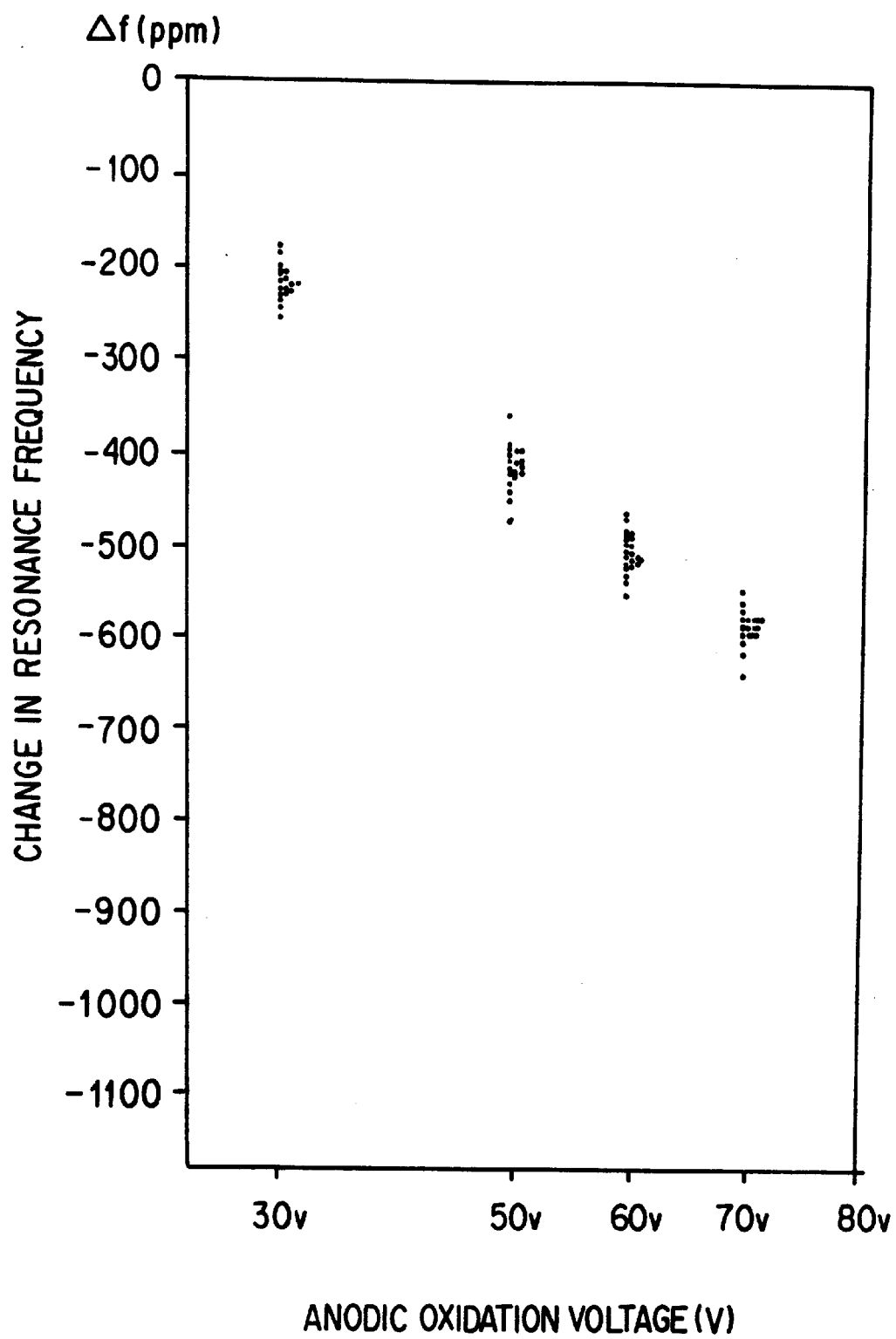
FIG. 24 is a graph showing a state where the resonance frequency is changed due to the anodic oxidizing voltage.

FIG. 24 shows changes in the resonance frequency of a plurality of wafers with respect to the anodic oxidation voltages where the anodic oxidation voltage is about 50 V. As can be understood from the above figure, adjustment of the oxidation voltage enables resonance frequency to be adjusted in units of ppm. Therefore, if the electrodes on either side of the IDT are anodicoxidized, the resonance frequency can be measured in the wafer state. In accordance with the measurements, anodic oxidation is further performed, and therefore surface acoustic wave resonators having arranged resonance frequencies can be easily obtained. Thus, the anodic oxidation of the electrodes will enable devices to be realized that exhibit durability against problems due to dust, so that the foregoing excellent characteristics can be maintained.

Surface Mounting Type Device

Figure 25:
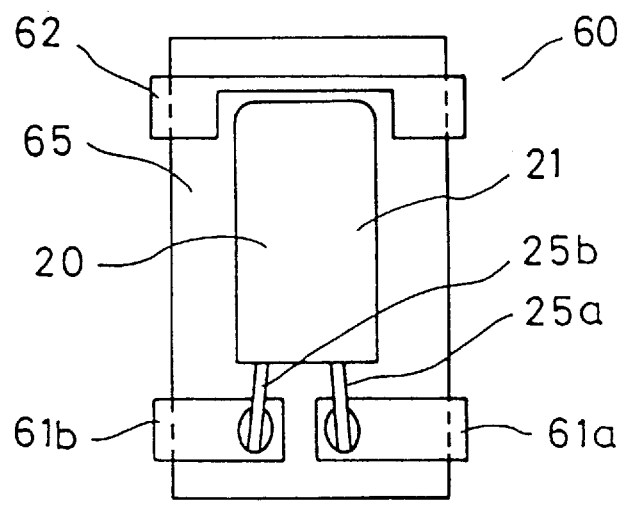
FIG. 25 is a perspective view showing a device of a surface mounting type formed by molding the surface acoustic wave resonator unit shown in FIG. 5.

FIG. 25 is a perspective view in which the surface acoustic wave resonator unit 20 having the surface acoustic wave resonator shown in FIG. 5 accommodated in a cylindrical case by the cantilever mounting method so as to be formed into a surface mounting type device 60. In the device 60, leads 25a and 25b outwardly project over the case 21, in which the surface acoustic wave resonator is airtight-sealed, and are attached to corresponding lead frames 61a and 61b by, for example, welding, soldering or a conductive adhesive agent. Furthermore, a lead frame 62 is disposed on a side of the cylindrical case 21 opposing the side on which the leads project. The lead frames 61 and 62 and the case 21 are integrated by a resin 65. The lead frames 61a and 61b are used to establish electrical connection with the surface mounting type surface acoustic wave resonator unit 60. The lead frame 62 is used as a dummy lead to maintain the strength when the surface acoustic wave resonator unit 60 is mounted on the board. Since the elements are integrally molded into a rectangular parallelpiped by resin 65, mounting on the substrate can be performed using an automatic mounting technique.

Figure 26:
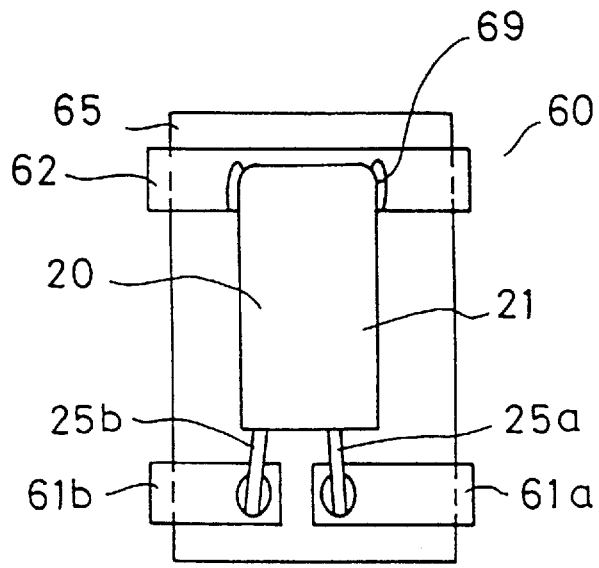
FIG. 26 is a diagram showing a surface mounting type device of a type having a surface acoustic wave resonator unit that can be grounded.
Figure 27:
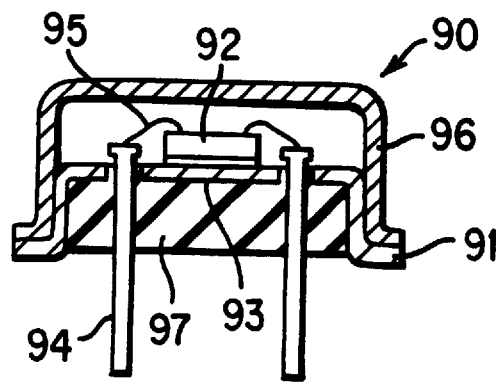
FIG. 27 is a cross sectional view showing a structure of a conventional surface acoustic wave resonator unit.
Figure 28:
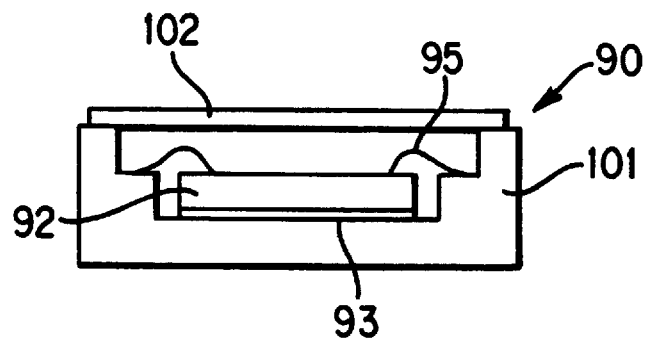
FIG. 28 is a diagram showing a structure of a conventional surface acoustic wave resonator unit different from that shown in FIG. 27.
Figure 29:
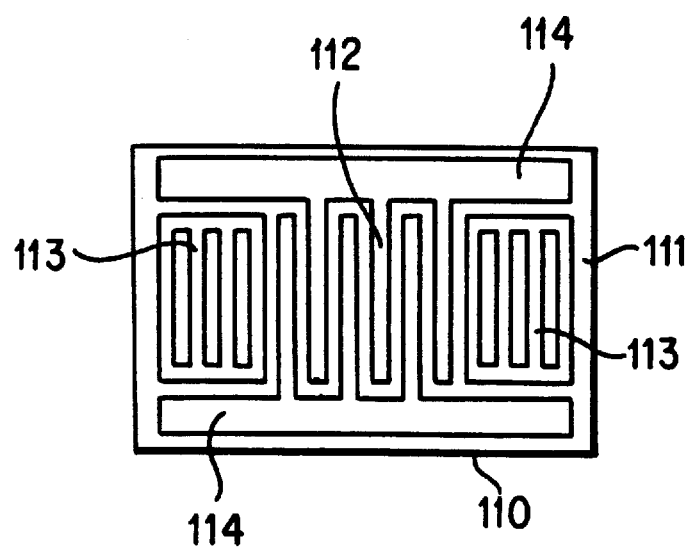
FIG. 29 is a plan view showing a structure of a conventional surface acoustic wave resonator.

FIG. 26 shows a surface mounting type surface acoustic wave resonator unit 60 in which the lead frame 62 is used, in the foregoing embodiment, as the dummy lead, and is electrically connected to the cylindrical case 21. The lead frame 62 can be electrically connected to the case 21 at a position 69 which comes in contact with the case 21 by a method, such as contact, press fit, soldering or a conductive adhesive agent. By bringing the lead frame 62 into contact with the case 21, as described above, the metal case 21 can be connected to the ground, that is grounded through the lead frame 62. The surface acoustic wave resonator unit is usually used at a high-frequency of several hundred MHz. Thus, grounding of the case 21 can shield noise existing as electric waves in space. Furthermore, the surface acoustic wave resonator unit serving as the noise source can be prevented. By grounding a metal case, such as the box-like case, as well as the cylindrical case grounded through the lead frame, a surface acoustic wave device of a surface mounting type able to withstand noise can be provided.

Each of the foregoing surface acoustic wave devices has the surface acoustic wave resonator mounted in the case by the cantilever method. Thus, a surface acoustic wave resonator unit capable of generating very stable resonance frequency can be obtained. Furthermore, the surface acoustic wave resonator unit has excellent characteristics, such as a low resonance resistance and a large Q-value. In addition, integral-molding with the lead frame by a resin enables a surface mounting type device exhibiting excellent surface mounting characteristics to be easily obtained. Since the surface acoustic wave resonator is mounted by a cantilever method by using a conductive adhesive agent or non-conductive adhesive agent, it has excellent impact resistance. If anodic-oxidized films are formed on the electrodes, problems, such as short circuit due to shock can be prevented. Thus, the present invention enables a surface acoustic wave resonator unit exhibiting excellent conductivity and high quality to be provided.

What is claimed is:

1. A surface acoustic wave resonator unit, comprising:
   a surface acoustic wave resonator, comprising:
   a substantially rectangular piezoelectric member having a main surface, a reverse surface, a first side surface and a second side surface, and a first end surface and a second end surface, the main surface having a central portion, a first and a second adjacent portion adjacent to the central portion along a longitudinal axis of the member, and a first and a second end portion corresponding to longitudinal ends of the member, wherein the central portion and the first and second adjacent portions are disposed between the first and second end portions,
   an interdigital transducer formed in the central portion on the main surface, and
   a first reflector and a second reflector formed in the first and the second adjacent portions, respectively, on the main surface;
   a supporting member for supporting said surface acoustic wave resonator, the supporting member connected to one of the first and the second end portions of the surface acoustic wave resonator; and
   a hollow housing for housing the surface acoustic wave resonator, the housing having a central axis, wherein the main surface is inclined with respect to the central axis.

2. A surface acoustic wave resonator unit according to claim 1, wherein said surface acoustic wave resonator and said supporting member are connected to each other through a non-conductive adhesive agent.

3. A surface acoustic wave resonator unit according to claim 1, wherein the housing extends along said surface acoustic wave resonator.

4. A surface acoustic wave resonator unit according to claim 3, wherein said housing is formed of metal and is formed in a shape selected from at least one of the group comprising a cylinder; a round can; and a box, said surface acoustic wave resonator is sealed in said housing by said supporting member, and further comprising a plurality of leads penetrating said supporting member and electrically connected to said interdigital transducer of said surface acoustic wave resonator.

5. A surface acoustic wave resonator unit according to claim 4 further comprising a mounting for the surface acoustic wave resonator unit, a lead frame electrically connected to said lead; and a lead frame electrically connected to said housing, wherein said surface acoustic wave resonator unit and said lead frame are integrally molded by resin, and the cylindrical case is electrically connected to the dummy lead of the lead frame.

6. A surface acoustic wave resonator unit according to claim 3, wherein said surface acoustic wave resonator is sealed in said housing and the atmosphere in said housing is substantially a vacuum.

7. A surface acoustic wave resonator unit according to claim 3, wherein said surface acoustic wave resonator is sealed in said housing, and an inert gas is sealed in said housing.

8. A surface acoustic wave resonator unit according to claim 3, wherein said housing is a ceramic case having a substantially box-like shape that is capable of sealing said surface acoustic wave resonator, a portion of said ceramic case forming said supporting member, and a deducing pattern electrically connected to said interdigital transducer of said surface acoustic wave resonator formed on said supporting member.

9. A surface acoustic wave resonator unit according to claim 3, wherein said surface acoustic wave resonator is connected to said supporting portion through a lead, and an end of said lead, which is in contact with said surface acoustic wave resonator, being inclined with respect to said central axis of said housing.

10. A surface acoustic wave resonator unit according to claim 3 further comprising a mounting for the surface acoustic wave resonator unit, wherein a plurality of leads electrically connected to said interdigital transducer outwardly extend from said housing, a lead frame electrically connected to said leads are provided, said surface acoustic wave resonator unit and said lead frame are integrally molded by resin, and the cylindrical case is electrically connected to the dummy lead of the lead frame.

11. A surface acoustic wave resonator unit according to claim 1, wherein at least two leads penetrate said supporting member and at least two connection lands being formed on said surface acoustic wave resonator as to be respectively connected to said leads; said surface acoustic wave resonator is attached to said supporting member through said leads; and said connection lands are formed on at least one of the main surface, the reverse surface, the first and the second side surfaces and the first and the second end surfaces of said surface acoustic wave resonator in a length-wise direction of said surface acoustic wave resonator.

12. A surface acoustic wave resonator unit according to claim 11, wherein said leads have connection ends being substantially flat shapes in contact with said connection lands.

13. A surface acoustic wave resonator unit according to claim 12, wherein leading ends of said connection ends are branched into at least two sections.

14. A surface acoustic wave resonator unit according to claim 11, wherein said leads are connected to said connection lands by a conductive adhesive containing an oxidation inhibitor.

15. A surface acoustic wave resonator unit according to claim 11, wherein said leads are connected to said connection lands by a conductive adhesive agent and said connection lands have at least one scratch formed thereon.

16. A surface acoustic wave resonator unit according to claim 11, wherein said connection lands have a bump formed thereon.

17. A surface acoustic wave resonator unit according to claim 1, wherein an oxide film of about 280 Å or thicker is formed by anodic oxidation on at least either surface of a pair of electrodes that form said intedigital transducer.

18. A surface acoustic wave resonator unit according to claim 1, wherein only either of a pair of electrodes that form said interdigital transducer has an oxide film of about 280 Å or thicker formed by anodic oxidation.

19. A surface acoustic wave resonator unit, comprising:

a surface acoustic wave resonator, comprising:

a substantially rectangular piezo-electric member having a main surface, a reverse surface, a first side surface and a second side surface, and a first end surface and a second end surface, said main surface having a central portion, a first and a second adjacent portion adjacent to said central portion along a longitudinal axis of said member, and a first and a second end portion corresponding to longitudinal ends of said member, wherein said central portion and said first and second adjacent portions are disposed between said first and second end portions, an interdigital transducer formed in said central portion on said main surface, and a first reflector and a second reflector formed in said first and said second adjacent portions, respectively, on said main surface;

a supporting member for supporting said surface acoustic wave resonator;

a housing for housing said surface acoustic wave resonator, said housing being formed of metal and being formed in a shape selected from a round can or a box; and a plurality of leads penetrating said supporting member, said leads having flat, plate-shaped end portions, said leads connected to one of said first and said second end portions of said surface acoustic wave resonator and electrically connecting to said interdigital transducer of said surface acoustic wave resonator, wherein the lengthwise direction of said leads is almost perpendicular to said main surface and wherein said main surface is attached to said flat end portions of said leads.

* * * * *